United States Patent
Leanza

(10) Patent No.: US 6,788,224 B2
(45) Date of Patent: Sep. 7, 2004

(54) METHOD FOR NUMERIC COMPRESSION AND DECOMPRESSION OF BINARY DATA

(75) Inventor: Elena Leanza, Rome (IT)

(73) Assignee: ATOP Innovations S.p.A., Milan (IT)

(*) Notice: Subject to any disclaimer, the term of this patent is extended or adjusted under 35 U.S.C. 154(b) by 94 days.

(21) Appl. No.: 10/311,924

(22) PCT Filed: Jun. 25, 2001

(86) PCT No.: PCT/IT01/00329

§ 371 (c)(1), (2), (4) Date: Dec. 20, 2002

(87) PCT Pub. No.: WO02/01728

PCT Pub. Date: Jan. 3, 2002

(65) Prior Publication Data

US 2004/0113820 A1 Jun. 17, 2004

(30) Foreign Application Priority Data

Jun. 26, 2000 (IT) .................................... KM2000A0347

(51) Int. Cl.[7] .............................................. H03M 7/00
(52) U.S. Cl. ......................................... 341/50; 341/51
(58) Field of Search ............................. 341/50, 51, 67

(56) References Cited

U.S. PATENT DOCUMENTS 4,187,500 A * 2/1980 Stakhov et al. ............... 341/80

OTHER PUBLICATIONS

PCT Notification of Transmittal of the International Search Report, no date.
Robust universal complete codes for transmission and compression, Aviezri S. Fraenkel, Shmuel T. Klein, Discrete Applied Mathematics 64 (1996) 31–55, no date.
Robust Transmission of Unbounded Strings Using Fibonacci Representations, Alberto Apostolico, Aviezri S. Fraenkel, IEEE Transactions on Information Theory, vol. IT–33, No. 2, Mar. 1987.
Security Audit for Embedded Avionics Systems, K.N. Rao, Eng., Hughes Aircraft Co. Radar Systems Group, no date.

* cited by examiner

Primary Examiner—Brian Young
Assistant Examiner—Joseph Lauture
(74) Attorney, Agent, or Firm—Hunton & Williams LLP

(57) ABSTRACT

A method for numerical representation particularly advantageously applicable to storage of data and to transmit and receive operations of signals modulated by digital data and adapted to minimize by a selective rate the data amount, under maintainment of their integrity.

66 Claims, 9 Drawing Sheets

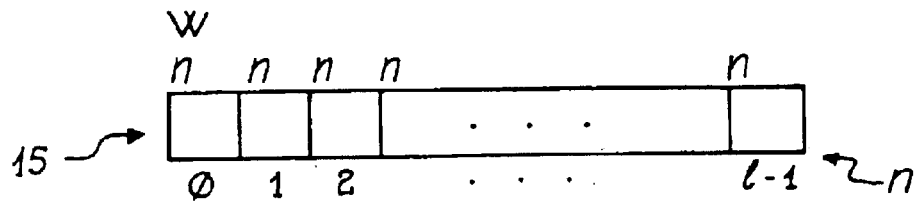
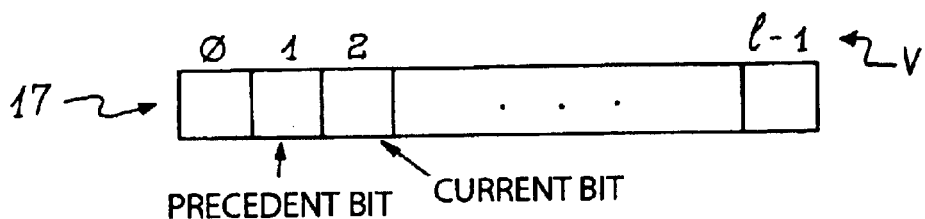
FIG. 4
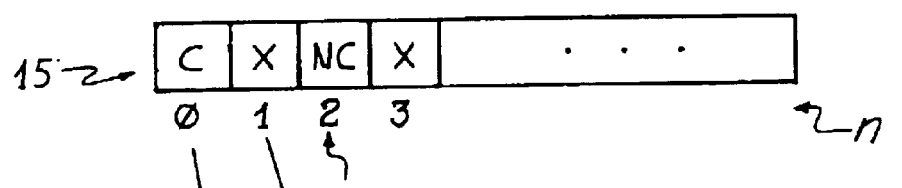
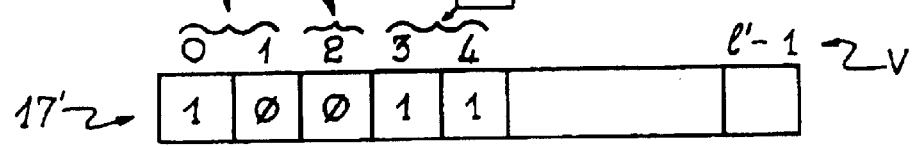
FIG. 6

METHOD FOR NUMERIC COMPRESSION AND DECOMPRESSION OF BINARY DATA

FIELD OF THE INVENTION

This broadly relates to a method for numerical representation that can be advantageously applied to a method for compression and decompression of digital data, while allowing a minimization of selectable degree of the data amount and while maintaining their integrity.

BACKGROUND OF THE INVENTION

It is known that one of the main problems in the computer technology and, more broadly, in the telecommunication technology, lies in the even increasing amount of data to be processed.

This entails a heavy exploitation of computer readable memories, such as removable (for instance CD-ROMS and floppy disks) or fixed (so-called computer Hard Disks) memory medium as well as an extended occupation of the telecommunication networks during information transmission, which, in turn, entails a higher transmission error probability, a higher transmission cost and a physical limitation to the feasibility of real time specific applications. In this regard, some applications can be mentioned in which transmission channels with limited capability are required for transmission of a noticeable amount of data; in detail, mention can be made of the attempt to realise an interactive television system, known as Video-on-Demand, based upon a twin wire telephone network that, due to intrinsic relevant channel limitations, is necessarily bound to transmit a lower data amount, thereby jeopardising the television image resolution.

The present numeric representation of digital data, namely the binary representation, is believed to be the most efficient and reliable.

When it is considered that the amount of information pieces stored in computers and/or exchanged through telecommunication networks is at present rapidly increasing, also due to the strong thrust exerted by the Internet Informatic Network extensively utilising information comprising large data amounts (such as the digital images), the problem of reducing the amount of data representing both information and application programs appears to be extremely critic.

Many approaches have been developed to solve the above mentioned problem, providing for encoding data represented in binary format, according to suitable methods, is in order to reduce the memory occupancy. Such encoding methods are usually particularly advantageous when they are applied to specific data types to be encoded, with specific characteristics. In other words, each individual encoding method turns out to be more or less advantageous according to whether it is applied for instance to data representing stationary images or to data representing video images or to data representing sounds.

The encoding methods can be classified based upon congruence between decoded data and original data or based upon fixed or variable length representation of original data and encoded data.

The first classification type divides the concerned encoding methods into methods having no information loss or "lossless" methods, in which the data reconstructed or decoded from the encoded data are identical to the original ones, and methods having information losses or "lossy" methods, in which the reconstructed data lose a portion of the original data information. Examples of lossless methods are the Run Length Encoding (RLE), the Huffman encoding method and the Lempel-Ziv-Welch or LZW encoding method; an example of lossy method is the Coarser Sampling and/or Quantization or CS&Q method.

According to the second classification type, the RLE and LZW encoding methods entail variable length original data and fixed length encoded data, the Huffman encoding method entails fixed length original data and variable length encoded data, the CS&Q encoding method entails both original data and encoded data with fixed length.

However, just because each encoding method is designed in connection with a specific type of data to be encoded, newer and newer encoding requirements for data having particular characteristics are being encountered.

Furthermore, the search of improved encoding methods aimed at even more compressing the data to be stored and/or transmitted is being even more developed.

SUMMARY OF THE INVENTION

The approach according to various embodiments of the present invention is to be considered in this context.

It is an object of this invention, therefore, to provide a method for numeric representation that is valid for any kind of data, is available to a "lossless" compression and decompression method for digital data, while it enables the data amount to be selectively minimized.

It is specific subject matter of this invention a compression method for compressing an input data binary string, having a number L of bits, to a compressed output data binary string, having a number X of bits, characterized in that at least one sub-string $a_{n-1}a_{n-2} \ldots a_1 a_0$ (1, 46, 70), having a number n of bits, of the input binary string is construed by assigning a integer numeric value N equal to the sum of the items of a monotonic increasing succession $S=\{s_0, s_1, s_2, \ldots\}$ of integer numbers, among the first n items of such succession S, whose corresponding $a_i$ is equal to "1," according to formula $$N = a_{n-1} \cdot s_{n-1} + a_{n-2} \cdot s_{n-2} + \ldots + a_1 \cdot s_1 + a_0 \cdot s_0 = \sum_{i=0}^{n-1} a_i \cdot s_i$$

and, for each substring $a_{n-1}a_{n-2} \ldots a_1 a_0$, a compressed binary sub-string $d_{m-1}d_{m-2} \ldots d_1 d_0$ is created, comprising m bits, in which the binary representation of said integer numeric value N, as assigned to the corresponding sub-string $a_{n-1}a_{n-2} \ldots a_1 a_0$, is stored, the binary representation of N being furnished by formula $$N = d_{m-1} \cdot 2^{m-1} + d_{m-2} \cdot 2^{m-2} + \ldots + d_1 \cdot 2^1 + d_0 \cdot 2^0 = \sum_{i=0}^{m-1} d_i \cdot 2^i,$$

said output data binary string comprising, for each sub-string $a_{n-1}a_{n-2} \ldots a_1 a_0$, the corresponding compressed binary sub-string $d_{m-1}d_{m-2} \ldots d_1 d_0$ and the data of said input binary string lacking of said at least one sub-string an $a_{n-1}a_{n-2} \ldots a_1 a_0$, the ratio $$R_k = \frac{s_k}{s_{k-1}},$$

where k=1, 2, . . . , between two consecutive items of said succession S, fulfilling the condition expressed by formula $R_k < 2$ where $k \geq q \geq 1$, the number n of bits of said at least one sub-string $a_{n-1}a_{n-2} \ldots a_1 a_0$ being in the range between a minimum value $n_{min}$ and the number L of bits included in said input data binary string, according to formula:

$$n_{min} \leq n \leq L$$

the minimum value $n_{min}$ being equal to the minimum value of n that fulfills the following condition:

$$m = int_{sup}\left[\log_2\left(\sum_{i=0}^{n-1} s_i\right)\right] < n$$

where the function $y=int_{sup}[x]$ returns the minimum integer value not lower than x ($y \geq x$).

In particular, according to the invention, the first item $s_0$ of said succession S is equal to 1 ($s_0=1$), while the second item $s_1$ of said succession S is equal to 2 ($s_1=2$).

Again according to this invention, the ratio $R_k$ between two consecutive items of said succession S trends to a constant value R when said index k increases, according to formula $$\lim_{k \to \infty} R_k = R$$

Further according to this invention, said ratio $R_k$ between two consecutive items of said succession S is never higher than 2, or $$R_k \leq 2 \text{ where } k \geq 1.$$

Again according to this invention, starting from the (r+1)-th item, or, for $k \geq r$, each item $s_k$ of said succession S is equal to a polynomial of the p preceding items, where $1 \leq p \leq r$, according to formula $$s_k = \sum_{h=1}^{p} e_h \cdot s_{k-h} \text{ per } k \geq r \geq p,$$

where the p coefficients $e_h$, where h=1, 2, ..., p, are constant positive, negative or zero integer numeric values.

In particular, the succession S is defined by the following formula:

$$S = S_{Fib} = \{s_0, s_1, s_2, ...\} = \begin{cases} s_0 = 1 \\ s_1 = 2 \\ s_k = s_{k-1} + s_{k-2} \end{cases} \text{ where } k \geq 2$$

Preferably, according to this invention, $n \geq 10$ or $n \geq 13$.

The method according to this invention can comprise:

an initial step in which the information relating to the number L of bits of said input data binary string is stored;

a subsequent step in which the input binary string is assigned to an auxiliary string designated as "CURRENT STRING";

a loop of steps comprising in this order:
  a compression block to compress the CURRENT STRING to a second auxiliary string designated as "COMPRESSED STRING";
  a check step to check whether said CURRENT STRING has been effectively compressed;
  a check step, performed when the result of the preceding check step (7) is positive, to check whether said COMPRESSED STRING has a size greater than a pre-established value D, where D<L,
  an assignment step, performed when the result of the preceding check step is positive, to assign COMPRESSED STRING to CURRENT STRING, and subsequent repetition of the step loop, starting from said compression block;
  a check step, performed when the result of one of the two preceding check steps is negative, to check whether the size of the juxtaposition of the information concerning the size L and of the COMPRESSED STRING is smaller than L;
  an assignment step, performed when the result of the preceding check step that checks the size of the juxtaposition is positive, to assign the juxtaposition of the information relating to size L and of the COMPRESSED STRING to the output data binary string; and
  an assignment step, performed when the result of the preceding check step that checks the size of the juxtaposition is negative, to assign the input data binary string to the compressed output data binary string.

In particular, the information concerning the number L of bits of the input data binary string is stored by a preestablished number t of bits.

According to a first embodiment of this invention, said step block for compressing said CURRENT STRING to said COMPRESSED STRING comprises the following steps:
  subdividing said CURRENT STRING into 1 sub-strings comprising n bits, where $n \geq n_{min}$, and
  scanning said sub-strings at least once.

Preferably, according to this invention, said step block for compressing said CURRENT STRING to said COMPRESSED STRING, when the size W of said CURRENT STRING is not a multiple of n, fills at least a sub-string with a tail of bits equal to "0."

Furthermore, said step block for compressing said CURRENT STRING to said COMPRESSED STRING, when the size W of said CURRENT STRING is not a multiple of n, fills the last sub-string with a tail of bits equal to "0."

Again according to this invention, said block for compressing said CURRENT STRING to said COMPRESSED STRING, for each sub-string not comprising two consecutive bits equal to "1," designated as canonical sub-string, and not successive to an other canonical sub-string, in the scanning order, creates a corresponding compressed binary sub-string $d_{m-1}d_{m-2} \ldots d_1 d_0$.

Additionally, said block for compressing said CURRENT STRING to said COMPRESSED STRING, for each substring not comprising two consecutive bits equal to "1," designated as canonical substring, creates a corresponding compressed binary sub-string $d_{m-1}d_{m-2} \ldots d_1 d_0$.

In particular, said block for compressing said CURRENT STRING to said COMPRESSED STRUNG, performs a processing operation on each sub-string comprising at least two consecutive bits equal to "1," designated as redundant or not canonical sub-string, and not successive in the scanning order to an other sub-string for which a compressed binary sub-string has been created, and, when the sub-string obtained by processing said redundant sub-string is canonical, creates a compressed binary sub-string $d_{m-1}d_{m-2} \ldots d_1 d_0$ corresponding to said processed sub-string.

Additionally, said block for compressing said CURRENT STRING to said COMPRESSED STRING, performs a processing operation on each sub-string comprising at least two consecutive bits equal to "1," designated as redundant or not canonical sub-string, and, when the sub-string obtained by processing said redundant sub-string is canonical, creates a compressed binary sub-string $d_{m-1}d_{m-2} \ldots d_1d_0$ corresponding to said processed sub-string.

Furthermore, said block for compressing said CURRENT STRING to said COMPRESSED STRING performs said processing operation during the same scan of the l sub-strings in which it creates the compressed binary sub-strings corresponding to the canonical sub-strings.

Again according to this invention, said block for compressing said CURRENT STRING to said COMPRESSED STRING performs said processing operation in a scan of the l sub-strings subsequent to the scan during which it creates the compressed binary sub-strings corresponding to the canonical sub-strings.

Again according to this invention, said compression block performs said processing operation for each redundant or not canonical sub-string that is not adjacent, in the scanning order, to another sub-string for which a compressed binary sub-string has been created.

In particular, said processing operation can include a logic NOT operation.

Furthermore, said processing operation can include a logic XOR operation with at least one mask or a logic XOR operation with a mask, comprising a number r of bits not higher than n ($r \leq n$), which mask is defined as the one that makes the maximum number of redundant sub-strings to be processed canonical.

Again particularly, said processing operation can comprise a binary arithmetic operation, preferably performed by means of at least a binary constant, comprising a number r of bits not higher than n ($r \leq n$).

Again according to this invention, said block for compressing said CURRENT STRING to said COMPRESSED STRING also creates a header string comprising, for each of the l sub-strings into which said CURRENT STRING is subdivided, an assembly of bits which indicates whether the corresponding sub-string of the CURRENT STRING has been compressed and/or whether the corresponding sub-string of the CURRENT STRING has been compressed after having been processed and/or the processing type performed on the corresponding sub-string of the CURRENT STRING.

In particular, the header string comprises l bits, each of which uniquely corresponds to a sub-string of the CURRENT STRING and it is equal to "1," if the corresponding sub-string is compressed, or it is equal to "0," if the corresponding sub-string is not compressed.

Further according to this invention, the header string comprises, for each sub-string of said CURRENT STRING that is compressed after having been processed, at least a corresponding bit to indicate the processing type performed on the corresponding sub-string.

In a particular embodiment of the method according to this invention, the header string further comprises said at least one mask.

In an other particular embodiment of the method according to this invention, the header string further comprises said at least one binary constant.

In particular, the block for compressing said CURRENT STRING to said COMPRESSED STRING also compresses said header string.

Still more particularly, said compression step block compresses at least one sub-string $a_{n'-1}a_{n'-2} \ldots a_1a_0$, having a number n' of bits, where $n' \leq l$, of the header string according to the method, in which the succession S is defined by the following formula:

$$S = S_{Fib} = \{s_0, s_1, s_2, \ldots\} = \begin{cases} s_0 = 1 \\ s_1 = 2 \\ s_k = s_{k-1} + s_{k-2} \end{cases} \text{where } k \geq 2$$

and particularly with n'=n.

Again according to this invention, said compression block compresses at least one sub-string $a_{n'-1}a_{n'-2} \ldots a_1a_0$, having a number n' of bits, where $n' \leq l$, of the header string according to the Run Length Encoding (RLE) method.

Further according to this invention, a flag comprising one or more bits is inserted ahead of or following to said COMPRESSED STRING, whose binary value indicates the compression type of the header string.

In a further embodiment of the method according to this invention, the block for compressing said CURRENT STRING to a COMPRESSED STRING comprises:

a first step iteration, in which a scan of the l sub-strings into which the CURRENT STRING is subdivided is effected and during which, for each sub-string not comprising two consecutive bits equal to "1," designated as canonical sub-string, a corresponding compressed binary string $d_{m-1}d_{m-2} \ldots d_1d_0$ is created, a first header string being also created during such scan and comprising, for each of said l sub-string into which said CURRENT STRING is subdivided, a bit that is equal to "1," if the corresponding sub-string is compressed, or a bit that is equal to "0," if the corresponding sub-string is not compressed, and one or more further step iterations, in which a processing operation is performed on each sub-string in respect of which, during the preceding iteration, no corresponding compressed binary sub-string $d_{m-1}d_{m-2} \ldots d_1d_0$ has been created, and, when the sub-string as furnished by said processing operation is canonical, a compressed binary sub-string $d_{m-1}d_{m-2} \ldots d_1d_0$ corresponding to the processed sub-string, is created; during each further iteration, a corresponding header string is created which comprises, for each sub-string in connection with which no corresponding compressed binary sub-string $d_{m-1}d_{m-2} \ldots d_1d_0$ has been created, a bit that is equal to "1," if the corresponding sub-string has been compressed after having been processed, or a bit that is equal to "0," if the corresponding sub-string is not compressed after having been processed.

In particular, said processing operation comprises a logic NOT and/or a logic XOR with at least one mask and/or a logic XOR with at least one mask including a number r of bits not higher than n ($r \leq n$), which is designated as the mask that makes the maximum number of sub-strings, in respect of which no corresponding compressed binary sub-string $d_{m-1}d_{m-2} \ldots d_1d_0$ was created during the preceding iteration, canonical.

Further according to this invention, said header string further comprises said at least one mask.

Again according to this invention, that said processing operation comprises a binary arithmetic operation, particularly performed with at least one binary constant comprising a number r of bits not higher than n ($r \leq n$).

Furthermore, said header string can comprise said at least one binary constant.

Again according to this invention, said step block for compressing said CURRENT STRING to said COMPRESSED STRING also compresses the first header string and/or at least one of said further header strings.

In particular, said compression block compresses the first header string and/or at least one of said further header strings according to the method in which said compression block compresses at least one sub-string $a_{n'-1}a_{n'-2} \ldots a_1a_0$, having a number n' of bits, where n'≦1, of the header string according to the method, in which the succession S is defined by the following formula:

$$S = S_{Fib} = \{s_0, s_1, s_2, \ldots\} = \begin{cases} s_0 = 1 \\ s_1 = 2 \\ s_k = s_{k-1} + s_{k-2} \end{cases} \text{ where } k \geq 2$$

and particularly with n'=n.

In further embodiment according to this invention, said block for compressing said CURRENT STRING to said COMPRESSED STRING comprises:

a) a first iteration of steps, in which:
a first scan of the CURRENT STRING is performed by means of a first window (59) having a size $n_{11} \leq n_{min}$ not higher than a maximum value WD, said first window scanning said CURRENT STRING by shifting itself by a bit pitch $WS_1$, in the range of 1 to WD ($1 \leq WS_1 \leq WD$), each time said first window identifies a sub-string not comprising two consecutive bits equal to "1," designated as canonical sub-string $C_{n_{11}}$ having a size $n_{11}$, an index that identifies the position of said canonical sub-string $C_{n_{11}}$ within said CURRENT STRING is stored and said canonical sub-string $C_{n_{11}}$ is compressed to a compressed binary sub-string according to the Fibonacci compression procedure, at the end of the scan, the number $G_1$ of canonical sub-strings $C_{n_{11}}$ that have been compressed and those portions of the CURRENT STRING not belonging to canonical sub-strings $C_{n_{11}}$ having a size $n_{11}$, are juxtaposed to one another in a first reject is string, and b) one or more further steps in which
a scan of the reject string furnished by the preceding iteration is performed by means of a corresponding further window having a progressively decreasing size $n_{1g} < n_{1g-1}$, said further window scanning the concerned reject string by shifting itself by a bit pitch $WS_g$ in the range of 1 to $WS_{g-1}$ ($1 \leq WS_g \leq WS_{g-1}$),
each time said first windows identifies a canonical sub-string $C_{ng}$ having a size $n_{1g}$, an index that identifies the position of said canonical sub-string $C_{ng}$ within said reject string furnished by said preceding iteration is stored and said canonical sub-string $C_{ng}$ is compressed to a compressed binary sub-string according to the Fibonacci procedure,
at the end of the scan, the number $G_g$ of canonical sub-strings $C_{ng}$ that have been compressed and those portions of the reject string furnished by the preceding iteration, not belonging to canonical sub-strings $C_{ng}$ having a size $n_{1g}$, are juxtaposed to one another in a corresponding further reject string,
the iteration of the steps being terminated when
the latest generated reject string is void, or
the latest generated reject string is too small to be effectively compressed, or
the size $n_{1g}$ of the last scanning window is equal to ($n_{min}-1$), said COMPRESSED STRING comprising:
the number F of scans performed up to the latest scan during which an effective compression operation has been performed,
the reject string generated by the latest iteration F, and
for each scan g, where g=1, . . . , F:
the number $G_g$ of canonical sub-strings $C_{n_{1g}}$ that have been compressed,
for each canonical sub-string $C_{n_{1g}}$:
the index $i_{gs}$ (where s=1, . . ., $G_g$) identifying the position of the canonical sub-string within the reject string generated by the preceding iteration (g-1), and
the compressed sub-string $SC_{gs}$ (where s=1, . . . , $G_g$).

In particular, said CURRENT STRING has a size not greater than a maximum value M and preferably M=1024.

Again according to this invention, WD<M and preferably WD=64.

Again according to this invention, $n_{1g} = n_{1g-1} - 1$.

Further according to this invention, $WS_g = WS_{g-1}$.

In particular, according to this invention, $WS_1 = 1$.

Preferably according to this invention, said block for compressing said CURRENT STRING to said COMPRESSED STRING comprises, preliminary to said first iteration of steps, a processing operation of said CURRENT STRING.

In a further embodiment of the method according to this invention, said block for compressing said CURRENT STRING to said COMPRESSED STRING comprises a first step for counting the number P of bits equal to "1" occurring in said CURRENT STRING.

In particular, when said number P fulfils the following condition $$\frac{P}{L} < \left(1 - \frac{m}{n}\right),$$

an extended string is created starting from the CURRENT STRING by juxtaposing a bit "0" to each of said P bits equal to "1".

Further according to this invention, when said number P fulfils the following condition $$\frac{P}{L} \geq \left(1 - \frac{m}{n}\right),$$

a logic NOT operation is performed on said current string and an extended string is created starting from the string generated by said not operation by juxtaposing a bit "0" to each bit equal to "1".

In a further embodiment of the method according to this invention, said block for compressing said CURRENT STRING to said COMPRESSED STRING comprises performing a logic XOR operation on said CURRENT STRING by means of at least one mask comprising a number r of bits not higher than L ($r \leq L$), designed in order that the string generated by said XOR operation fulfils the following condition $$\frac{P}{L} < \left(1 - \frac{m}{n}\right),$$

and subsequently creating an extended string starting from the string generated by said XOR operation by juxtaposing a bit "0" to each bit equal to "1."

In a further embodiment of the method according to this invention, in the frame of said block for compressing said CURRENT STRING to said COMPRESSED STRING, each of said 1 sub-strings, into which said CURRENT STRING is subdivided is compressed to a compressed sub-string including a first portion, designated as "mantissa," comprising a number m of bits, furnished by the method according to the Fibonacci compression procedure, and a second portion, designated as "exponent," comprising a number z of bits, that is variable as the mantissa varies, where $z \geqq 0$ and equal to the number of bits needed for representing the number of n-bit strings to which the same integer numeric value N corresponds, when they are construed by means of the succession according to the Fibonacci compression procedure, said compression block further providing for pre-establishing an order of all of the n-bit strings, to which the same integer numeric value N corresponds, and for the exponent to identify the index of the redundant representation corresponding to the compressed sub-string, said COMPRESSED STRING comprising said compressed sub-strings.

In particular, according to this invention, when the number of n-bit strings to which the same integer numeric value N corresponds, when they are construed by means of the succession according to the Fibonacci compression procedure, is higher than 1, the string not comprising two consecutive bits equal to "1," designated as canonical string, is expressed by said exponent by means of z bits equal to "0."

Again according to this invention, said block for compressing said CURRENT STRING to said COMPRESSED STRING can comprise the following steps:

providing a redundancy ordering of all of said n-bit strings to which the same integer numeric value N corresponds, when they are construed by means of the succession according to Fibonacci, said string redundancy ordering including a first and a second redundancy order, performing a first step iteration comprising:
compressing all of the sub-strings corresponding to the first redundancy order and storing information concerning their position within the input binary string
forming a first reject string by juxtaposing those portions of said input binary string not comprising sub-strings corresponding to the first redundancy order to one another, performing a set of further step iterations, each in respect of a corresponding further redundancy order, each further iteration comprising:
compressing all of the sub-strings corresponding to the further redundancy order and storing information concerning their position within the reject string furnished by the preceding iteration,
forming a further reject string by juxtaposing those portions of said reject string furnished by said preceding iteration not comprising sub-strings corresponding to the further redundancy order to one another, forming said COMPRESSED STRING by juxtaposing at least the following data for each iteration:
the number of compressed sub-strings,
the compressed sub-strings, and for each iteration with exclusion of the last one:
information concerning the positions of the compressed sub-strings within said input binary string or within said reject string furnished by said preceding iteration.

In particular, the method can be terminated as soon as all of the sub-strings into which the input binary string was subdivided are compressed.

Preferably, according to this invention, the n-bit strings construed according the Fibonacci succession, not comprising two consecutive bits equal to "1" and designated as canonical strings, belong to the first redundancy order.

This invention further concerns a method for decompression of a compressed binary string characterized in that said compressed binary string is generated starting from a data binary string comprising a number L of bits, by means of the described compression method.

This invention also covers an electronic apparatus comprising at least a central processing unit and at least a memory unit, characterized in that it performs the compression method as above described, as well as an electronic apparatus comprising at least a central processing unit and at least a memory unit, characterized in that it performs the described decompression method.

It is further subject matter of this invention an electric, magnetic or electromagnetic signal modulated by a digital signal comprising at least one data string, wherein said at least one data string is a compressed binary string generated, starting from a data binary string having a number L of bits, by means of the above compression method.

This invention further describes and claims a memory medium readable by a processor containing at least one data string, characterized in that said at least one data string is a compressed binary string generated, starting from a data binary string having a number L of bits, by means of the above described compression method.

Further specific subject matter of this invention is a processor program comprising code means adapted to perform, when they operate on a processor, the herein described and claimed compression method, as well as a memory medium readable by a processor, having a program stored therein, characterized in that said program is a processor program as above mentioned.

Again specific subject matter of this invention is a processor program comprising code means adapted to perform, when they operate on a processor, the herein described and claimed decompression method, as well as a memory medium readable by a processor, having a program stored therein, characterized in that said program is a processor program as above described.

BRIEF DESCRIPTION OF THE DRAWINGS

This invention will be now described by way of illustration, not by way of limitation, according to its preferred embodiments, by particularly referring to the Figures of the annexed drawings, in which:

FIG. 4 schematically shows two strings as used and/or processed by the method of FIG. 3;

FIG. 6 schematically shows some strings used and/or processed by a second embodiment of the compression method according to this invention.

DETAILED DESCRIPTION OF THE DRAWINGS

Figure 1:
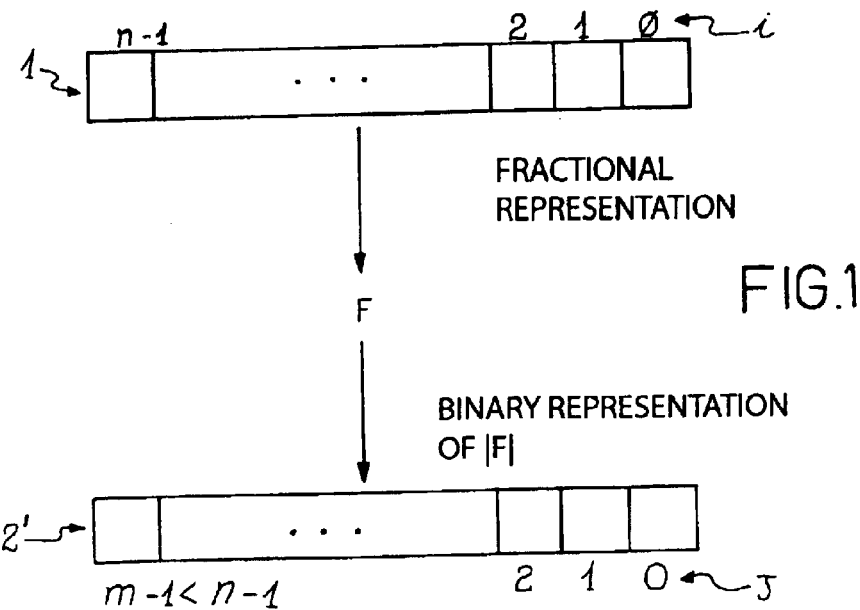
FIG. 1 schematically shows a binary string compression in which use is made of a new fractional numeric representation.

In the following description the same reference numerals will be utilised to designate the same items in the Figures.

The starting consideration of this invention relates to the symbolic representation of numerals.

At present, the more generalised representation of numerals, as ufilised also in representation of digital data, is based upon weighed positional numeration systems. Such systems utilise a limited assembly of elementary symbols $\{c_0 c_1 \ldots c_{b-1}\}$, called "figures," to which a generally progressive numeric value is assigned, whose number b (equal to a positive integer number higher than 1) is called "base" of the numeric system.

Given a numeral Z, which, for the sake of simplicity, but without loss of generalisation, is assumed as integer and positive, its numeric representation in base b and with n figures is furnished by a string of n symbols, each of which is equal to any one of said b figures and has a different numeric weight as a function of the position which it find itself in. The weights are equal to powers of said base b and the exponent is a function of the position. In other words, given a string of n symbols $a_{n-1} a_{n-2} \ldots a_1 a_0$, the corresponding numeral Z is given by a polynomial of n addends each of which is equal to the product of the numeric value of the corresponding figure by the corresponding numeric weight:

$$Z = a_{n-1} \cdot b^{n-1} + a_{n-2} \cdot b^{n-2} + \ldots + a_1 \cdot b^1 + a_0 \cdot b^0 = \sum_{i=0}^{n-1} a_i \cdot b^i \quad (1)$$

As it is known, in the general case of not-integer positive numerals, the decimal portion can be computed by introducing, on the right side of the symbol having the least significant weight, further symbols whose numeric weights are equal to powers of said base b in which the exponent is again function of the position and negative. In the case of negative numerals, various possible approaches exist to account for the sign of the numeral; for instance, the first symbol $a_{n-1}$ can have a significance of sign "+" or "−," or it can have also a negative weight equal to $(-b^{n-1})$. In the following specification, it is assumed that the represented numerals are positive numerals and, therefore, the representations of negative numerals (as well as other known representation, different from formula [1], such as the ones based upon mantissa and exponent) will be omitted.

The most popular numeric system is the decimal system, in which the base b is equal to 10.

In the computer and telecommunication technologies, the digital data generally have representations utilising a binary system, in which the base b is equal to 2 and whose two figures are symbols "0" and "1." The generalised use of such binary representation is firstly due to the efficiency and reliability of its implementations, in which the two mentioned figures correspond to only two states of a pre-established physical entity (for instance: absence or presence of a signal, minimum value or maximum value of a voltage). In particular, in the frame of such binary coding, the data can also be construed by means of different numeric systems, such as the octal (base b equal to 8) and hexadecimal (base b equal to 16) systems. Furthermore, particular codes, such as the decimal code represented in binary form or BCD, can exploit the binary system.

The binary n-figure representation of a numeral, on a n-bit binary numeral, can also be construed as the sum of powers $b^i = 2^i$, where $i = 0, 1, \ldots n-1$, whose corresponding figure is equal to "1." Only by way of exemplification, the 7-bit binary numeral 1000001 is equal to $$100000 = 2^6 + 2^0 = 64 + 1 = 65$$

Two properties of a binary representation significant for comprehension of this invention are the following:

the maximum positive integer value that can be represented by a n-bit binary numeral is equal to $(2^n - 1)$, and the number of different n-bit binary representations is equal to the number of arrangements with repetitions of 2 items in class n, equal to $2^n$.

The power succession $b^k = 2^k$ (where $k = 0, 1, 2 \ldots$) is an increasing monotonic succession of integer numerals $B = \{b_0, b_1, b_2, \ldots\}$ such that $b_0 = 1$ and the ratio $R_k$ between two subsequent items is a constant equal to base b:

$$R_k = \frac{b_{k+1}}{b_k} = b = 2$$

Therefore, a n-bit binary string an $a_{n-1} a_{n-2} \ldots a_1 a_0$ construed according a binary representation, represents a integer numeric value N equal to the sum of the items of succession B, among the first n items, whose corresponding bit $a_i$ is equal to "1."

$$N = a_{n-1} \cdot b_{n-1} + a_{n-2} \cdot b_{n-2} + \ldots + a_1 \cdot b_1 + a_0 \cdot b_0 = \sum_{i=0}^{n-1} a_i \cdot b_i \quad (2)$$

Based upon a novel numeric representation, the inventor developed a novel method for compressing digital data which, provided that certain conditions are fulfilled, enables them to be retrieved by a corresponding decompression method adapted to maintain their integrity.

Let us consider a numeric representation, which will be hereinbelow indicated as "fractional representation," in which the elementary symbol assembly again comprises the two binary bits "0" and "1," but whose base b is a non-integer numeral between 1 and 2:

$$1 < b < 2$$

A fractionally represented n-bit numeral F will have a generally not-integer value furnished by formula [1]. In particular, the maximum value $F_{MAX}$ that can be represented by a fractionally represented n-bit numeral F is equal to:

$$F_{MAX} = \sum_{i=0}^{n-1} b^i = \frac{b^n - 1}{b - 1}$$

It is apparent that $$F_{MAX} < 2^n - 1,$$

namely $F_{MAX}$ is smaller than the maximum, integer and positive value that can be represented by a n-bit binary numeral.

This means that, neglecting the decimal portion, a n-bit fractionally represented numeric value can be fractionally represented numeric value can be expressed in a binary representation by a m-bit string, in which the number m of bits is not higher than n ($m \leq n$).

$$m = \text{int}_{sup}[\log_2 F_{MAX}] = \text{int}_{sup}\left[\log_2\left(\frac{b^n - 1}{b - 1}\right)\right] \leq n \quad (3)$$

where the function $y = \text{int}_{sup}[x]$ furnishes the maximum integer value not smaller than $x$ ($y \geq x$).

In particular, a minimum n value, $n_{min}$, starting from which m is lower than n, for any numeric value that can be represented.

$$m < n \text{ for } n \geq n_{min} \quad (4)$$

Furthermore, it is apparent from formula (3) that the greater the n value, the greater is the difference (n−m) between the number of bits of the fractional representation and that of the fractional representation, thereby consequently enabling to achieve a greater reduction $\Delta = (n-m)$ of representation bits.

By referring to FIG. 1, it can be observed that this makes a compression of digital data, as represented by means of binary strings and as utilised in computer and telecommunication technologies.

In fact, given a n-bit binary string 1 with $n \geq n_{min}$, in which the bits are designated in the Figure by an index i=0, 1, 2, ..., n−1 (such a string can be stored for instance in one or more memory registers, when such string 1 is construed by means of a n-bit fractional representation, a generally non-integer value F is obtained from formula (1). By neglecting the fractional portion of said value F, the integer portion of value F is represented in a binary representation by a m-bit string $2^1$ with m<n, whose bits are indicated in the Figure by an index j=0, 1, 2, ..., m−1, thereby saving $\Delta$ bits.

It is, however, apparent that, since the decimal portion of value F has been disregarded, it is not generally possible to retrieve the starting binary string 1 from the binary string $2^1$ by performing a simple de-compression operation in order to inversely follow the compression steps illustrated by referring to FIG. 1. More precisely, when it is desired to retrieve the original binary string 1 starting from binary string $2^1$, it would be necessary, during the compression operation, to maintain further information relating to the decimal portion of value F, whose storage would counterbalance the saving of $\Delta$ bits, with possible increase in the number of bits representing the information contained in the starting binary string 1.

The inventor developed a novel numeric representation that can be alternatively utilisable in stead of the above described fractional representation and enables the original binary string to be retrieved in simple manner, starting from a compressed string, so as to guarantee an effective bit saving.

The method according to this invention utilises the formalism expressed in formula (2) for representing a positive integer numeral, by resorting to an increasing monotonic succession $S = \{s_0, s_1, s_2, \ldots\}$ of integer numerals other than the binary succession B. Preferably $$s_0 = 1$$

Even more preferably, $$\begin{cases} s_0 = 1 \\ s_1 = 2 \end{cases} \quad (5)$$

The generally non-integer ratio $$R_k = \frac{S_k}{S_{k-1}} \text{ (where } K = 1, 2, \ldots)$$

between two subsequent items of succession S is generally variable according to the k index. Obviously, since S is an increasing monotonic succession, said ratio $R_k$ is always higher than 1:

$$R_k > 1 \text{ for } k \geq 1 \quad (6)$$

The items $S_k$ (for k=0, 1, 2, ...) of succession S according to this invention fulfil the condition that, starting from the (q+1)th item where $q \geq 1$, said ratio $R_k$ is a non-integer numeral lower than 2:

$$R_k < 2 \text{ for } k \geq q k \geq 1 \quad (7)$$

Preferably, said ratio $R_k$ trends to a constant value R as said index k increases:

$$\lim_{k \to \infty} R_k = R \quad (8)$$

Even more preferably, said ratio $R_k$ is never higher than 2:

$$R_k \leq 2 \text{ for } k \geq 1 \quad (9)$$

Therefore, given a n-bit binary string $a_{n-1} a_{n-2} \ldots a_1 a_0$, the compression method according to this invention construes the same by allowing to it a integer numeric value N equal to the sum of the items of succession S, among the first n items, whose corresponding bit $a_i$ is equal to "1"

$$N = a_{n-1} \cdot s_{n-1} + a_{n-2} \cdot s_{n-2} + \ldots + a_1 \cdot s_1 + a_0 \cdot s_0 = \sum_{i=0}^{n-1} a_i \cdot s_i \quad (10)$$

Based upon the property expressed by formula (7), it is apparent that, given a integer numeric value N, the properties expressed by formulae (3) and (4) also apply to the representation according to formula (10). More precisely, given a integer numeric value N represented by a n-bit binary string $a_{n-1} a_{n-2} \ldots a_1 a_0$, according to formula (10), such value N can be represented in a binary representation by a m-bit binary string $d_{m-1} d_{m-2} \ldots d_1 d_0$, whose number of bits is not higher than n. Additionally, a minimum value $n_{min}$ exists for n, starting from which m is always lower than n, for any value N. In particular, the higher is the value of n, the greater is the difference (n−m) between the number of bits of the representation according to formula (10) and the number of bits of the binary representation, thereby allowing a consequent even higher saving Δ=(n−m) in the representation bits.

The inventor has developed many methods to establish a succession S whose items $S_k$ (where k=0, 1, 2, ... ) fulfil the condition set forth by formula (7). Only by way of exemplification, bit not by way of limitation, any item $S_k$, at least starting from an index r (being k≧r) can be equal to a function f adapted to return integer values of p preceding items, where 1≦p≦r:

$$S_k = f(S_{k-1}, S_{k-2}, \ldots S_{k-p}) \text{ per } k > r \quad (11)$$

For instance, function f of formula (11) can be a polynomial of said p preceding items:

$$S_k = \sum_{h=1}^{p} e_h \cdot s_{k-h} \text{ per } k \geq r \quad (12)$$

where the constant coefficients $e_h$ (for h=1, 2, ... p) are preferably integer numerals having positive, negative or zero values.

The preferred embodiment of the invention utilises a succession $S_{Fib}$ directly stemming from the succession known as "Fibonacci succession," wherein each item, with the exception of at least the first two items ("at least" because different definitions of the Fibonacci succession exist in the literature in respect of the first items), is equal to the sum of the two immediately preceding items. More precisely, the succession utilised in the preferred embodiment of this invention is defined as follows:

$$S = S_{Fib} = \{s_0, s_1, s_2, \ldots\} = \begin{cases} s_0 = 1 \\ s_1 = 2 \quad \text{per } k \geq 2 \\ s_k = s_{k-1} + s_{k-2} \end{cases} \quad (13)$$

In the following description, the representation of a integer numeric value by means of succession $S_{Fib}$ according to formula (10) is designed as "Fibonacci representation."

It is immediately apparent that the items of succession $S_{Fib}$ fulfil the condition set forth by formula (5) and can be expressed by formula (12) by assuming p=r=2

$e_1 = e_2 = 1$

It is also immediately apparent that the ratio $R_k$ between two consecutive items $S_k$ and $S_{k-1}$ of succession $S_{Fib}$ fulfils the conditions set forth by formula (6), by formula (7) where k≧2(or where q=2), by formula (8) where R=1, 61803 . . . and by formula (9).

TABLE Ia

| n = k + 1 | $s_k = s_{n-1}$ | $N_{Fib_{MAX}}$ | m |
|---|---|---|---|
| 1 | 1 | 1 | 1 |
| 2 | 2 | 3 | 2 |
| 3 | 3 | 6 | 3 |
| 4 | 5 | 11 | 4 |
| 5 | 8 | 19 | 5 |
| 6 | 13 | 32 | 6 |
| 7 | 21 | 53 | 6 |

TABLE Ia-continued

| n = k + 1 | $s_k = s_{n-1}$ | $N_{Fib_{MAX}}$ | m |
|---|---|---|---|
| 8 | 34 | 87 | 7 |
| 9 | 55 | 142 | 8 |
| 10 | 89 | 231 | 8 |
| 11 | 144 | 375 | 9 |
| 12 | 233 | 608 | 10 |
| 13 | 377 | 985 | 10 |
| 14 | 610 | 1595 | 11 |
| 15 | 987 | 2582 | 12 |
| 16 | 1597 | 4179 | 13 |
| 17 | 2584 | 6763 | 13 |
| 18 | 4181 | 10944 | 14 |
| 19 | 6765 | 17709 | 15 |
| 20 | 10946 | 28655 | 15 |
| 21 | 17711 | 46366 | 16 |
| 22 | 28657 | 75023 | 17 |
| 23 | 46368 | 121391 | 17 |
| 24 | 75025 | 196416 | 18 |
| 25 | 121393 | 317809 | 19 |
| 26 | 196418 | 514227 | 19 |
| 27 | 317811 | 832038 | 20 |
| 28 | 514229 | 1346267 | 21 |
| 29 | 832040 | 2178307 | 22 |
| 30 | 1346269 | 3524576 | 22 |
| 31 | 2178309 | 5702885 | 23 |
| 32 | 3524578 | 9227463 | 24 |
| 33 | 5702887 | 14930350 | 24 |
| 34 | 9227465 | 24157815 | 25 |
| 35 | 14930352 | 39088167 | 26 |
| 36 | 24157817 | 63245984 | 26 |
| 37 | 39088169 | 1.02E + 08 | 27 |
| 38 | 63245986 | 1.66E + 08 | 28 |
| 39 | 1.02E + 08 | 2.68E + 08 | 28 |
| 40 | 1.66E + 08 | 4.33E + 08 | 29 |
| 41 | 2.68E + 08 | 7.01E + 08 | 30 |
| 42 | 4.33E + 08 | 1.13E + 09 | 31 |

Tables $I_a$ and $I_b$ evidence, under variation of the number n of bits of a binary string $a_{n-1} a_{n-2} \ldots a_1 a_0$ by which a integer numeric value N is represented by the Fibonacci succession, item $S_k$ of succession $S_{Fib}$ corresponding to the most significant bit $a_{n-1}(S_{n-1})$, the maximum integer value $N_{FibMAX}$ that can be represented by formula (10) as well as the number m of bits of the binary string means $d_{m-1} d_{m-2} \ldots d_1 d_0$ by which $N_{FibMAX}$ can be represented by means of a binary representation. In particular, Table $I_a$ and Table $I_b$ are related to values of n variable from 1 to 42 and from 43 to 64, respectively. The minimum value $n_{min}$ of formula (4) is equal to 7 ($n_{min}$=7) and it will be apparent that, when n increases, the difference Δ=(n−n) between the number of bits of the Fibonacci representation and the number of bits of the binary representation increases, as well.

TABLE Ib

| n = k + 1 | $s_k = s_{n-1}$ | $N_{Fib_{MAX}}$ | m |
|---|---|---|---|
| 43 | 7.01E + 08 | 1.84E + 09 | 31 |
| 44 | 1.13E + 09 | 2.97E + 09 | 32 |
| 45 | 1.84E + 09 | 4.81E + 09 | 33 |
| 46 | 2.97E + 09 | 7.78E + 09 | 33 |
| 47 | 4.81E + 09 | 1.26E + 10 | 34 |
| 48 | 7.78E + 09 | 2.04E + 10 | 35 |
| 49 | 1.26E + 10 | 3.3E + 10 | 35 |
| 50 | 2.04E + 10 | 5.33E + 10 | 36 |
| 51 | 3.3E + 10 | 8.63E + 10 | 37 |
| 52 | 5.33E + 10 | 1.4E + 11 | 38 |
| 53 | 8.63E + 10 | 2.26E + 11 | 38 |
| 54 | 1.4E + 11 | 3.65E + 11 | 39 |
| 55 | 2.26E + 11 | 5.91E + 11 | 40 |
| 56 | 3.65E + 11 | 9.57E + 11 | 40 |
| 57 | 5.91E + 11 | 1.55E + 12 | 41 |
| 58 | 9.57E + 11 | 2.5E + 12 | 42 |

TABLE Ib-continued

| n = k + 1 | $s_k = s_{n-1}$ | $N_{Fib_{MAX}}$ | m |
|---|---|---|---|
| 59 | 1.55E + 12 | 4.05E + 12 | 42 |
| 60 | 2.5E + 12 | 6.56E + 12 | 43 |
| 61 | 4.05E + 12 | 1.06E + 13 | 44 |
| 62 | 6.56E + 12 | 1.72E + 13 | 44 |
| 63 | 1.06E + 13 | 2.78E + 13 | 45 |
| 64 | 1.72E + 13 | 4.49E + 13 | 46 |

Figure 2:
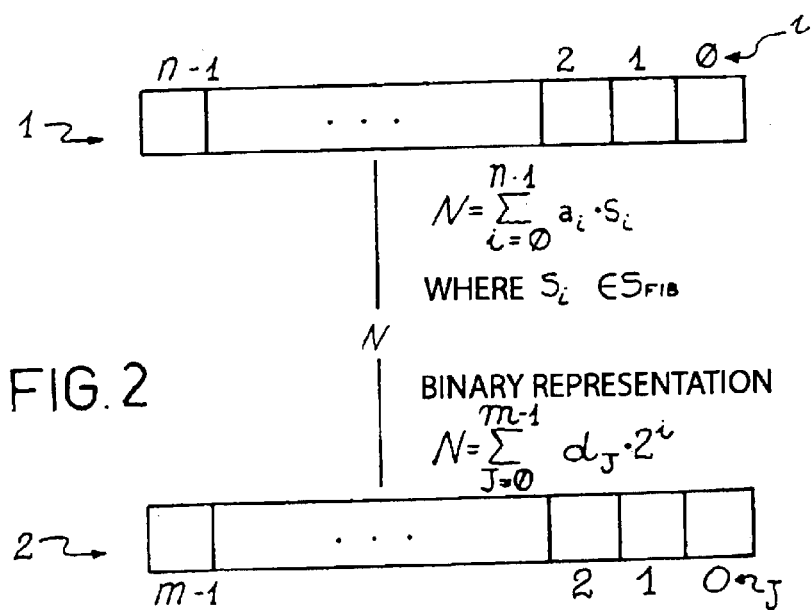
FIG. 2 schematically shows a binary string compression according to a preferred embodiment of the method of this invention.

By referring to FIG. 2, given a n-bit binary string 1, where $n \geq 7$, whose bits are marked in the Figure by an index i=0, 1, 2, ..., n−1, when such string 1 is construed by means of a n-bit Fibonacci representation, one obtains a integer numeric value N, given formula (10), that can be represented in a binary representation by a n-bit string 2, whose bits are marked in FIG. 2 by an index j=0, 1, 2, ..., m−1. In particular, the number m of bits of binary string 2 is equal to the number of bits of the binary representation of the maximum integer value $N_{Fib\ MAX}$ that can be represented by the Fibonacci representation. As above said, when the number n of bits of the starting binary string 1 increases, a higher saving of Δ bits is achieved in the compressed binary string 2 and, therefore, a higher compression is performed. On the other hand, value Δ being the same, it is convenient that said number n of bits be minimum, so as to achieve the maximum compression ratio CR.

$$CR = \frac{\Delta}{n} = \frac{n-m}{n} = 1 - \frac{m}{n} \quad (14)$$

In particular, Table II, that can be derived from Tables $I_a$ and $I_b$, evidences for each value Δ, the most convenient number n of bits, when n varies in the range $n_{min}$=6 to 64.

TABLE II

| Δ | n optimum |
|---|---|
| 1 | $n_{min}$ = 7 |
| 2 | 10 |
| 3 | 13 |
| 4 | 17 |
| 5 | 20 |
| 6 | 23 |
| 7 | 26 |
| 8 | 30 |
| 9 | 33 |
| 10 | 36 |
| 11 | 39 |
| 12 | 43 |
| 13 | 46 |
| 14 | 49 |
| 15 | 53 |
| 16 | 56 |
| 17 | 59 |
| 18 | 62 |

Anyway, since the number of different n-bit binary strings is equal to the number of dispositions with repetitions of 2 items of class n, equal to $2^n$, while the number of values that can be represented by a n-bit Fibonacci representation is equal to ($N_{Fib\ MAX}$+1) or is lower than $2^n$, some numeric values N can be represented by a Fibonacci representation by more than one string. This is apparent from formula (13) which evidences that a binary string "100" as construed by a Fibonacci representation furnishes the same numeric value as binary string "011." In the following description, the binary strings construed by the Fibonacci representation are designed as "canonical" strings, when they do not include two consecutive bits equal to "1" (in other words they do not include bit pairs equal to "11"), while they are designed as "non canonical" strings or also "redundant" strings, when they include at least two consecutive bits equal to "1" (in other words, they include at least a bit pair equal to "11").

In particular, given n bits, the number $N_{CS}$ of canonical strings is equal to $$N_{SC} = \begin{cases} \prod_{h=0}^{\frac{n}{2}-1} (n-2h) & \text{for } n \text{ even} \\ \prod_{h=0}^{\frac{n+1}{2}-1} (n-2h) & \text{for } n \text{ odd} \end{cases} \quad (15)$$

while the number $N_{RS}$ of redundant strings is equal to $N_{RS} = 2^n - N_{CS}$ $$N_{SR} = 2^n - N_{SC} \quad (16)$$

It will be immediately apparent to those skilled in the art to modify the method according to the invention by considering other strings as canonical strings, including also strings comprising at least a bit pair equal to "11."

It will additionally be immediately apparent to those skilled in the art to identify also by means of processing methods the canonical string and any redundant strings for each numeric value N that can be represented by a n-bit Fibonacci representation.

Therefore, by referring again to FIG. 2, during a de-compression operation, given a compressed binary string 2, the starting binary string 1 not always can be unequivocally ascertained without furnishing further information that enable to identify which Fibonacci string, taken among the various possible ones, corresponds to said numeric value N. In particular, the most convenient number of bits for each value Δ, as set forth in Table II for n variable in the range $n_{min}$=7 to 64, turns out to the advantageous also in connection with the number of redundant strings, which appears to is be minimum (with respect to other values of n corresponding to the same Δ).

The inventor developed various embodiments of the compression and decompression methods according to this invention that account for the possible redundant strings.

Figure 3:
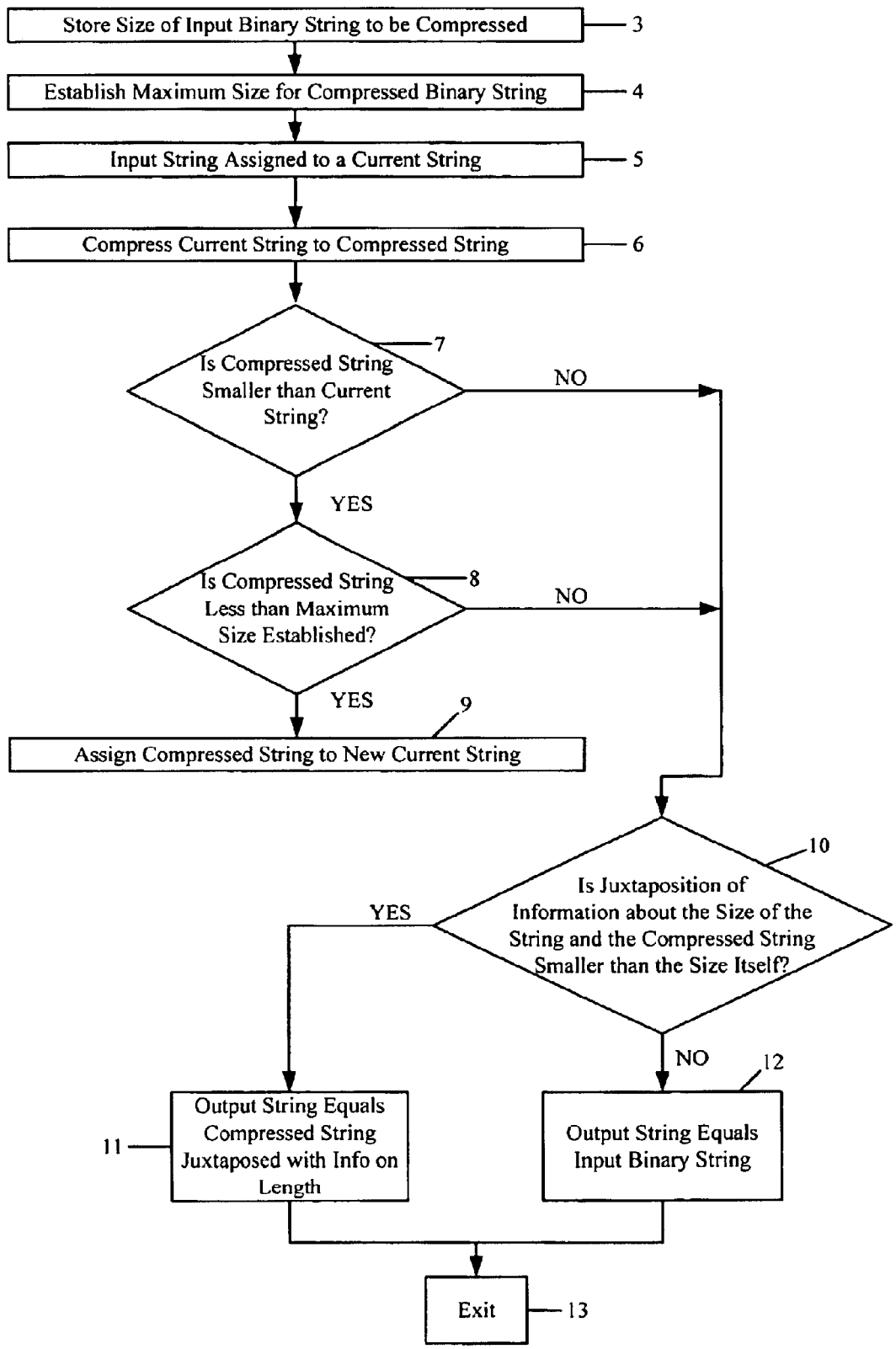
FIG. 3 shows a flow diagram of a first embodiment of the method according to this invention.

By referring to FIG. 3, it can be observed that the flow chart of the first embodiment of the compression method according to this invention includes a starting step 3 in which the size of the input binary string to be compressed, equal to the number of L bits, is stored. Preferably, the methods stores said size L always with the same number t of bits.

The method includes then a step 4 in which the maximum size D as desired for the compressed binary string is established. Such size D can be established by an operator also by assignting a maximum percentage value of the compressed binary string with respect to the size L of the input binary string.

In a subsequent step 5, the input string is assigned to an auxiliary string designated as "CURRENT STRING."

Subsequently, the method performs a set of steps starting with a compression block 6 wherein the CURRENT STRING is compressed, according to some steps that will be hereinbelow described in more detail and the compression result is assigned to a second auxiliary string, designated as "COMPRESSED STRING." The method performs then a step 7 wherein it is checked that the CURRENT STRING has been effectively compressed or that the COMPRESSED STRING has a smaller size than the CURRENT STRING; in the positive, a step 8 is performed to check whether the COMPRESSED STRING has a size greater than D and, in the positive, a step 9 is carried out to assign the COMPRESSED STRING to the CURRENT STRING and, subsequently, the method repeats the loop starting again from the compression block 6.

When the result of step 7 or of step 8 is negative (the CURRENT STRING has not been compressed or the COMPRESSED STRING has a size smaller than or equal to D), the method performs a step 10 to check whether the juxtaposition (designated by operator "&") of the information relating to size L (preferably stored by t bits) and of the COMPRESSED STRING is smaller than L: in the positive, the method performs a step 11 in which the juxtaposition of the information concerning size L and of the COMPRESSED STRING is assigned to an output string; in the negative, the method performs a step 12 wherein the input string is assigned to the output string, because it was not possible to compress such input string. In particular, step corresponding to steps 10, 11 and 12 can be provided also for other embodiments of the compression method according to this invention.

The method performs then a final exiting step 13.

Should the method be executed by a processor, the input string, the current string, the compressed string and the output string can be stored in suitable corresponding memory areas.

Compression block 6 carries out a compression of the current string by subdividing it into sub-strings each comprising n bits (where $n \geq n_{min}=7$) and by compressing only the canonical strings, according to the procedure shown in FIG. 2, and by avoiding to compress two consecutive sub-strings. Preferably, $n \geq 10$; even more preferably, $n \geq 13$. Block 6 creates a header string, having a number of bits equal to the number of sub-strings, such that each bit of the header string is equal to "1," if the corresponding sub-string is compressed, otherwise is equal to "0." Lastly, block 6 also compresses the header string, that is certainly canonical, since two consecutive sub-strings are never compressed.

Figure 5:
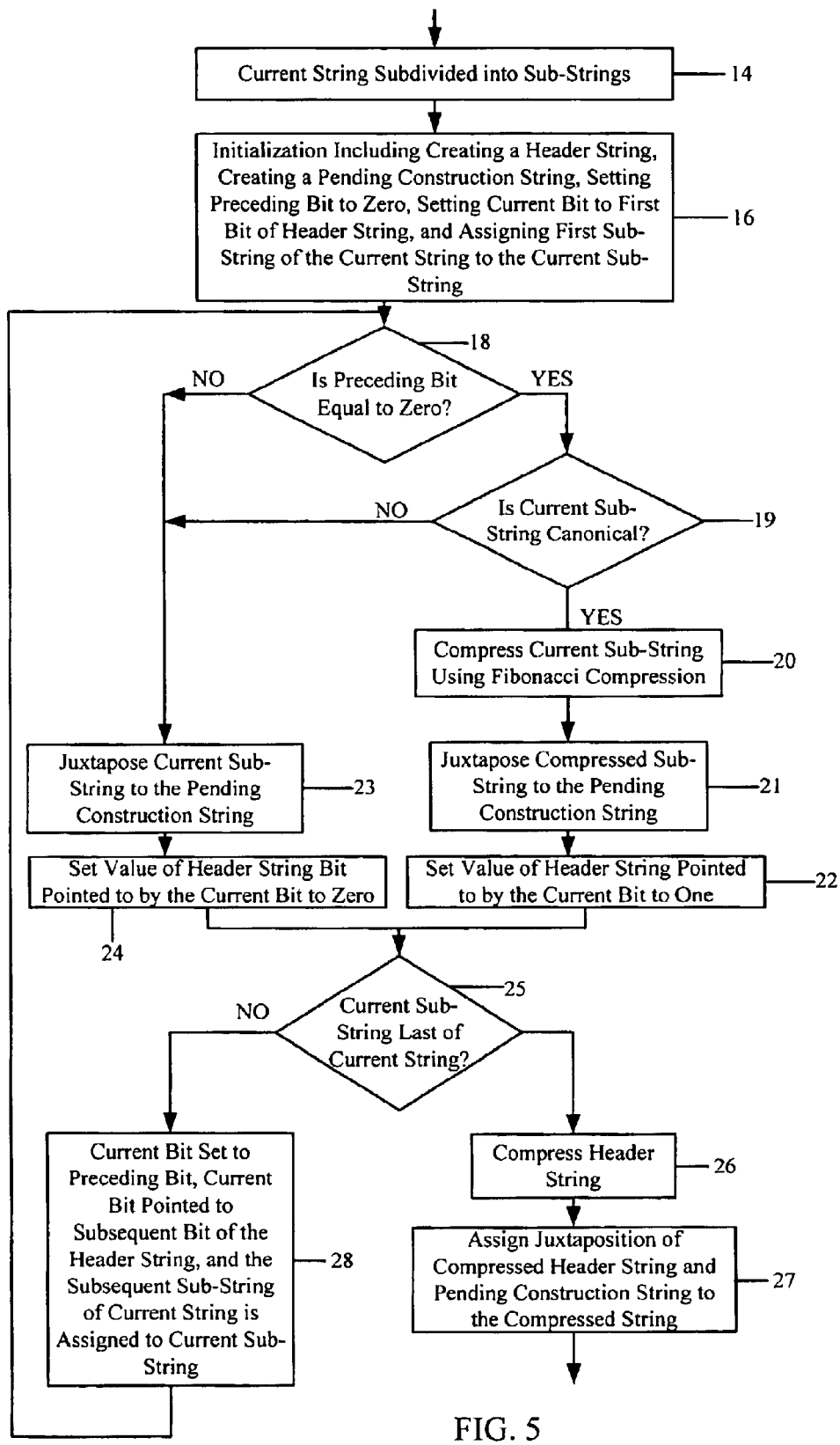
FIG. 5 shows a flow diagram of a particular step block of the method of FIG. 3.

More specifically, by referring to FIGS. 4 and 5, it can be observed that the compression block 6 performs a starting step 14 wherein the CURRENT STRING 15, comprising W bits, is subdivided into sub-strings each of which comprises n bits. In particular, the number l of sub-strings is given by $$l = int_{sup}\left[\frac{W}{n}\right] \quad (17)$$

In FIG. 4, the sub-strings are marked by an index u=0,1, 2, . . . l−1. Should the size W of the CURRENT STRING 15 be not a multiple of n, the last sub-string is filled by a bit tail equal to "0."

The compression block 6 subsequently performs an initialisation step 16 wherein a header string 17 is created comprising l bits, as shown in FIG. 4 by index v=0, 1, 2, . . . l−1;

an auxiliary string, designated as "PENDING CONSTRUCTION STRING" is created and initialised to a null or void string"";

a first auxiliary pointer variable, designated as "PRECEDING BIT," is initialised to point to a constant having a binary value equal to "0";

a second auxiliary pointer variable, designated as "CURRENT BIT" is initialised to point to the first bit of the header string; and the first sub-string of the CURRENT STRING 15 is assigned to an auxiliary variable designated as "CURRENT SUB-STRING."

Subsequently, the compression block 6 performs a set of steps whist starts with a step 18 by checking whether the value pointer to by PRECEDENT BIT is equal to "0." In the positive, a subsequent step 19 is carried out in order to check whether the CURRENT SUB-STRING is canonical.

When the result of checking step 19 is positive, a step 20 is performed to compress the CURRENT SUB-STRING according to the procedure shown in FIG. 2, henceforth designated as "Fibonacci compression." In particular, the n bits $a_{n-1} a_{n-2} \ldots a_1 a_0$ of the CURRENT SUB-STRING are construed according to the Fibonacci representation by computing their numeric value N, expressed by formula (10), that is then represented by a m-bit binary representation $d_{m-1}d_{m-2} \ldots d_1 d_0$, that is assigned to an auxiliary variable designated as "COMPRESSED SU-STRING."

After execution of step 20, a step 21 is performed to add (by juxtaposition) the COMPRESSED SUB-STRING to the PENDING CONSTRUCTION STRING and a step 22 is performed to assign a binary value "1" to the header string bit pointed to by the CURRENT BIT.

When, however, the result of step 18 or of step 19 is negative (the value pointed to by the PRECEDING BIT is equal to "1" or the CURRENT SUB-STRING is not canonical), the method performs a step 23 to add (by juxtaposition) the CURRENT SUB-STRING to the PENDING CONSTRUCTION STRING as well as a step 24 to assign a binary value "0" to the header string bit pointed to by the CURRENT BIT.

Subsequently both to step 22 and to step 24, a step 25 is performed in order to check whether the CURRENT SUB-STRING was the last sub-string of the CURRENT STRING 15. When the result is positive, a step 26 is performed to compress the header string and a step 27 is performed to assign the juxtaposition of the compressed header string and of the PENDING CONSTRUCTION STRING to the COMPRESSED STRING. Preferably, said step 26 can compress the header string by Run Length Encoding (RLE) or by means of a Fibonacci compression operation, possibly by subdividing the header string into sub-strings comprising a number n' of bits also different from n, by filling the last of them with the necessary zero tail and, preferably, by providing a pre-established number of sub-strings forming the header string. Again, the header string can be compressed both by RLE and by Fibonacci compression, by inserting ahead of the COMPRESSED STRING an indication bit or flag, the value of which indicates the compression type utilised to compress the header string.

Should the result of step 25 be negative, an up-dating step 28 is performed:

CURRENT BIT is assigned to PRECEDING BIT,

CURRENT BIT is up-dated to point to the subsequent bit of the header string, and the subsequent sub-string of CURRENT STRING 15 is assigned to CURRENT SUB-STRING.

In particular, FIG. 4 shows the situation relating to the third iteration of the step set in the flow chart of FIG. 5.

It will be immediately apparent to those skilled in the art to modify the embodiment of the just above described method when the canonical strings are different from those not comprising pairs of consecutive bits equal to "11": in this case, each bit of the header string could be equal to "0," if the corresponding sub-string is compressed, or equal to "1," if the corresponding sub-string is not compressed.

A second embodiment of the compression method according to this invention provides for processing at least a portion of the sub-string of the CURRENT STRING appearing not to be canonical, in order to make them canonical. According to such second embodiment, for each not canonical sub-string subsequent to a not compressed sub-string, a logic NOT operation is performed (by inverting the value of each individual bit) in order to check whether the concerned sub-string becomes canonical and, in the positive, the inverted sub-string is compressed. For each compressed sub-string, a bit pair is stored in the header string: the first bit of the pair is equal to "1," so as to indicate that the concerned sub-string is compressed, while the second bit of the pair is equal to "0," when the sub-string has not been inverted by said NOT operation, before being compressed, therefore, the header string has a generally not foreseeable number 1'≧1 of bits (1'=1 only in the case of no compressed string).

In particular, the above second embodiment provides a slightly different set of steps of the compression block 6 with respect to the one shown in the flow chart of FIG. 5.

Figure 7:
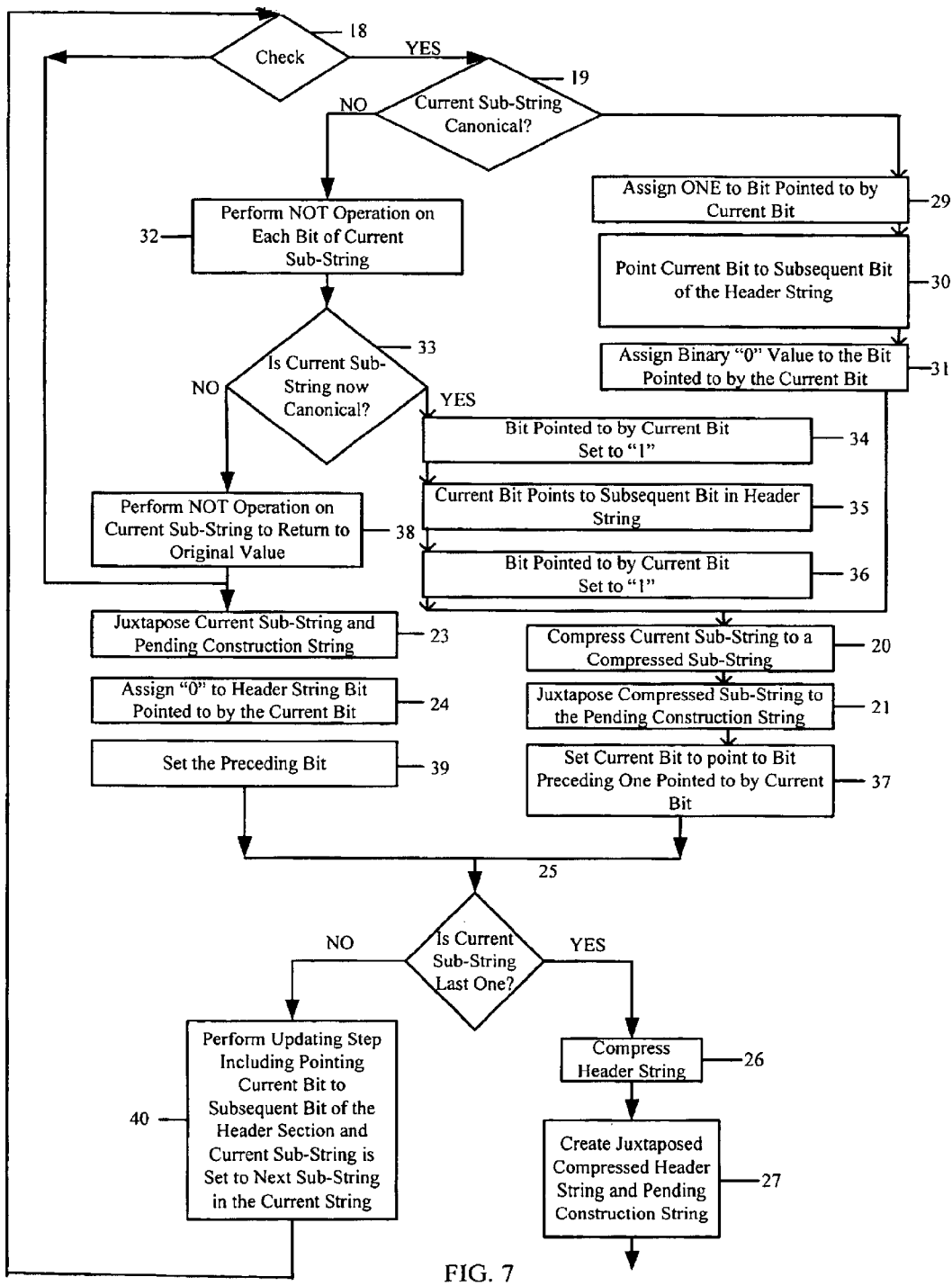
FIG. 7 shows a flow diagram of a particular step block of the method of FIG. 6.

By referring to FIGS. 6 and 7, it can be observed that, when the result of the check step 18 is positive, the step set also includes a further check step 19.

If the result of the check is positive, a step 19 is performed to assign a binary value "1" to the bit pointed to by the CURRENT BIT, a step 30 is performed to up-date said CURRENT BIT, that is updated so as to point to the subsequent bit of the header string, and a step 31 is performed to assign a binary value "0" to the bit pointed to by the CURRENT BIT. In other words, the considered sub-string of the CURRENT STRING 15 is canonical and can be compressed, under assignment of a binary value "10" to the corresponding bit pair of the header string.

If the result of step 19 is negative, a step 32 is performed as a logic NOT operation on said CURRENT SUB-STRING, whose bits are individually converted from "0" to "1" or from "1" to "0."

Subsequently to step 32, a step 33 is carried out to check that the CURRENT SUB-STRING is canonical.

When step 33 furnishes a positive result, a step 34 is performed to assign a binary value "1" to the bit of the header string pointed to by the CURRENT BIT, a step 35 is performed for up-dating the CURRENT BIT, that is updated so as to point to the subsequent bit of the header string, and a step 36 is performed to assign a binary value "1" to the bit of the header string pointed to by the CURRENT BIT. In other words, the considered sub-string of the CURRENT STRING 15 becomes canonical after the logic NOT operation and can be compressed, under assignment of a binary value "11" to the corresponding bit pair of the header string.

Subsequently both to step 31 and to step 32, a step 20 is performed in order to compress the CURRENT SUB-STRING to a COMPRESSED SUB-STRING, a step 21 is performed in order to add (by juxtaposition) the COMPRESSED SUB-STRING to a PENDING CONSTRUCTION STRING and a step 37 is performed to up-date the PRECEDING BIT, that up-dated so as to point to the bit of the header string that precedes the one pointed to by the CURRENT BIT (in order to point to the first bit of the pair corresponding to the compressed sub-string).

Should the result of step 33 be negative, a step 38 is performed as a logic NOT operation on the CURRENT SUB-STRING, in order to counteract the NOT operation of step 32 and reversing it to its original contents.

Both in the case the result of step 33 is negative and after step 38 (the value pointed to by the PRECEDING BIT is equal to "1" or the CURRENT SUB-STRING is not canonical and cannot be changed to a canonical one after a logic NOT operation), a step 23 is performed to juxtapose the CURRENT SUB-STRING to the PENDING CONSTRUCTION STRING, a step 24 is performed to assign a binary value "0" to the header string bit pointed to by the CURRENT BIT and step 39 is performed in order to up-date the PRECEDING BIT to which the CURRENT BIT is assigned.

Subsequently both to step 37 and to step 39, a step 25 is performed in order to check whether the CURRENT SUB-STRING were or not the last sub-string of the CURRENT STRING 15.

If the result is positive, a step 26 is performed so as to compress the header string and a step 27 is performed in order to assign the juxtaposition of the compressed header string and of PENDING CONSTRUCTION STRING. The header string can also advantageously include the number of sub-strings into which said CURRENT STRING 15 is subdivided.

Should, however, the result of the step 25 be negative, an up-dating step 40 is performed including:
 the CURRENT BIT is up-dated so as to point to the subsequent bit of the header section, and
 the subsequent sub-string of the CURRENT STRING 15 is assigned to the CURRENT SUB-STRING.

In particular, FIG. 6 illustrates the situation relating to the third iteration of the step set of the flow chard of FIG. 7. In FIG. 6, the canonical sub-strings of the CURRENT STRING 15 are designated by letter C, while the not-canonical or redundant ones are designates by letters NC. Additionally, the sub-strings designated by letter X are the ones that cannot be compressed because they are subsequent to a compressed sub-string and, in respect thereof, the result of the check step 18 is negative. It can be observed that the first sub-string is directly compressed, as it is a canonical one, and the corresponding bit pair in the header string has a binary value of "10," the second sub-string has a binary value is not compressed and the corresponding bit in the header string has a value of "0," the third sub-string is compressed after having been subjected to a logic NOT operation, so that the corresponding bit pair in the header string has a binary value of "11."

In a third embodiment of the compression method according to this invention, the step set of the compression block 6 shown in FIG. 7 does not include the step 18 aimed at checking whether the value pointed to by the PRECEDING BIT is equal to "0." The reason of this is that, since, in respect of compressed strings, after having subjected them to a logic NOT operation, the header string comprises bit pair equal to "11," the control of step 18 can be considered as quite unnecessary, because the insertion of pairs that make the header string non-canonical is anyway allowed. In such a case, the utilisation of the pointer variable PRECEDING BIT is fruitless. Consequently, step 16 of the compression lock should be modified by climatating the initialization of the PRECEDING BIT and the step set of FIG. 7 does not even include a step 37 and a step 39.

In a fourth embodiment of the compression method according to this invention, the processing operation of at least a portion of the sub-strings of the CURRENT STRING appearing not to be canonical, so as to make them canonical, takes place at the end of the CURRENT STRING scan, in contrast to the second embodiment in which such processing operation occurs sub-string by sub-string during such scan. In other words, said compression block 6 again includes the steps illustrated in the flow chart of FIG. 5, but, ahead of step 6 which compresses the header string, a new scan of the PENDING CONSTRUCTION STRING during which:
 any not compressed sub-string not adjacent to compressed sub-strings are located;

the identified sub-strings are processed, preferably by performing a logic NOT operation;

if the processed sub-strings are canonical, they are compressed;

the compressed sub-string is substituted for the corresponding original sub-string in the PENDING CONSTRUCTION STRING.

In this case and up to the last occurrence of step 25, the header string is the same as that obtained in connection with the first embodiment of the method according to FIGS. 4 and 5. During the new scan set of the PENDING CONSTRUCTION STRING, a bit for each compressed sub-string is added to the header string, more specifically a bit equal to "0," if the sub-string has (already) been compressed to its original format, or a bit equal to "1," if the sub-string is compressed after having been processed. If the sub-string is compressed after having been processed, the corresponding bit of the first section of the header string is also converted from "0" to "1."

Figure 8:
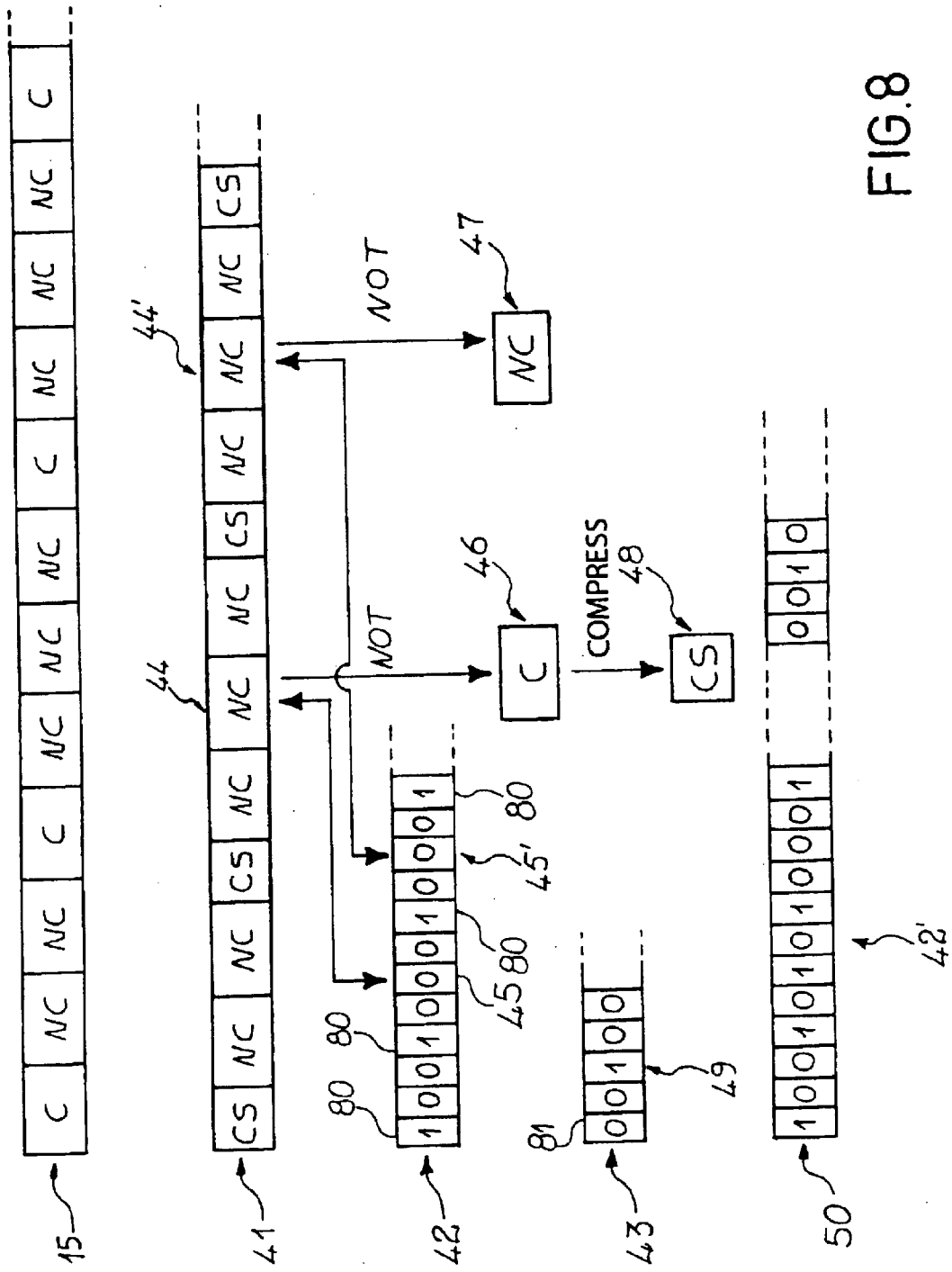
FIG. 8 schematically shows some strings used and/or processed by a farther embodiment of the compression method according to this invention.

It can be observed in the example of FIG. 8 that the CURRENT STRING 15 comprises both canonical sub-strings C and not canonical sub-strings NC.

At the end of the CURRENT STRING 15 scan, the PENDING CONSTRUCTION STRING 41 comprises compressed sub-strings CS and not canonical sub-strings NC, while the header string 42 comprises a bit for each sub-string, such bit being equal to "1," if it corresponds to a not canonical (and not compressed) sub-string NC.

During a new scan of the PENDING CONSTRUCTION STRING 41, a tail 43 of the header string is created so as to have bits corresponding to compressed sub-strings CS; in particular, for each compressed sub-string starting from the original sub-string, or for each bit 80 having a value "1" of the header string 42 as obtained at the end of the CURRENT STRING 15 scan, said tail 43 comprises a bit having a value "0."

Furthermore, during such new scan set, the not canonical sub-strings 44 and 44' are identified as processable sub-strings, because they are not adjacent to compressed sub-strings CS. In particular, the corresponding bits 45 and 45' of the header string are equal to "0" and are adjacent to preceding or subsequent bits also equal to "0."

The not canonical sub-strings 44 and 44' are subjected to a logic NOT operation and after having been so processed, they can appear to be canonical (as sub-string 46 in FIG. 8) or still not canonical (as sub-string 47 in FIG. 8). The sub-string 46 that became canonical after said logic NOT operation are compressed to corresponding sub-strings 48 which are substituted for the corresponding original sub-string 44 in the PENDING CONSTRUCTION STRING 41, while the corresponding bit 45 of the first section of the header string is converted from "0" to "1" and a corresponding bit 49 having a value "1" is added to the tail portion 43 of the header string.

At the end of the new scan course, the header string 50, obtained as a result of the juxtaposition of the first portion 42' (some bits of which have been possibly converted during the new scan course) and of the tail 43, is compressed.

The compressed string, not shown, furnished by the compression block is obtained by juxtaposition of the header string and of the PENDING CONSTRUCTION STRING 41. Alternatively, the first portion 42' of the header string can be separately compressed with respect to the tail portion 43 and the compressed string can be obtained by juxtaposition, at any order, of the first compressed portion of the header string, of the PENDING CONSTRUCTION STRING 41 and of the compressed tail portion of the header string.

Again, the compressed sub-string, can also be separately juxtaposed to the items comprising the compressed string.

In a fifth embodiment of the compression method according to this invention, the processing operation of at least some of the sub-string of the CURRENT STRING appearing not to be canonical still takes place at the end of the CURRENT STRING scan, but a logic XOR operation is performed by means of a purposely computed mask. In particular, the mask comprises a number r of bits not higher than n (where r≦n) and it is designed as the mask adapted to make the maximum number of not canonical processable sub-strings canonical (or, in other words, not adjacent to compressed sub-strings). In this fifth embodiment of the method, the XOR operation mask is inserted, possibly compressed separately from or together with a portion of the header string, into the compressed string furnished by compression block 6.

In a sixth embodiment of the compression method according to this invention, the sub-strings of the CURRENT STRING are compressed, possibly after having been processed in successive iterations in order to make them canonical, without imposing the condition that at least one of two adjacent strings be not compressed.

Figure 9:
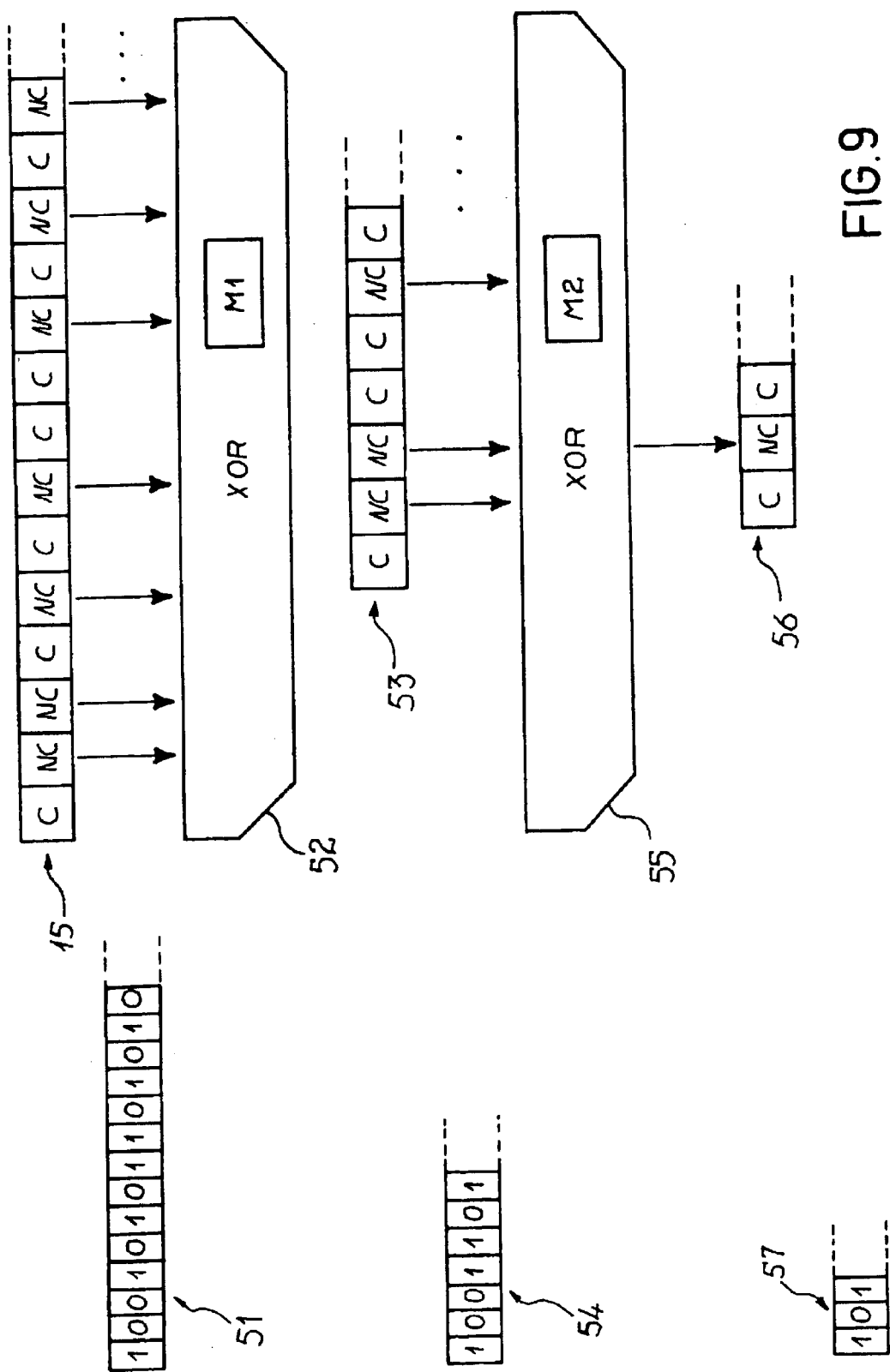
FIG. 9 schematically shows some strings used and/or processed by a further embodiment of the compression method according to this invention.

By referring to FIG. 9, it can be observed that the CURRENT STRING 15 comprises canonical sub-string C and not canonical sub-strings NC.

In the above mentioned sixth embodiment of the method, a first iteration is carried out in order that all canonical sub-strings C are compressed and a first header string 51 is created which comprises a number of bits equal to the number of sub-strings of the CURRENT STRING 15, having each bit equal to "1," if the corresponding sub-string C has been compressed due to the fact that it is a canonical sub-string, or it is equal to "0," if the corresponding sub-string NC has not been compressed, due to the fact that it is a not canonical sub-string.

According to this method, a second iteration is subsequently carried out in which the not canonical sub-strings NC of the CURRENT STRING 15 are subjected to a logic XOR operation 52 by means of a mask $M_1$ designed so as to make the maximum number of sub-strings NC canonical. In particular, said mask $M_1$ comprises a number r of bits not higher than the number n of bits comprising the CURRENT STRING 15 (where r≦n).

The string 53 as obtained by said XOR operation performed on the sub-strings NC of the CURRENT STRING 15 and on the mask $M_1$ comprises canonical sub-strings C and not canonical sub-strings NC. According to this method, all canonical sub-strings C of said string 53 are compressed and the method provides for creating a second header string 54 comprising a number of bits equal to the number of sub-strings of said string 53, similarly to the first header string 51 in respect of the CURRENT STRING 15.

In similar way, the method provides for a third iteration in which the not canonical sub-strings of said string 53 are subjected to a logic XOR operation 55 by means of a r-bit mask $M_2$, designed so as to make the maximum number of not canonical sub-strings NC canonical.

The string 53 as obtained by said XOR operation performed on the sub-strings NC of said string 53 and on the mask $M_2$ comprises canonical sub-strings C and not canonical sub-strings NC. According to this method, all canonical sub-strings C of string 55 are compressed and the method provides for creating a third header string 57, comprising a number of bits equal to the number of sub-strings of the string 56, similarly to the previous header strings 51 and 54.

The iteration number in this method can be pre-established or variable. In particular, according to this method, the iterations can be terminated when the number of still not canonical strings (equal to the number of bit having a value "0" in the lastly generated header string) is lower than a minimum threshold value, depending on the bit saving Δ for each sub-string as well as on the bit amount needed to store a further possibly compressed header string and a further possibly compressed mask.

A seventh embodiment of the compression method according to this invention provides for a repeatable set of operations aimed at performing a dynamic subdivision of the input binary string to be compressed. Such dynamic subdivision identifies and interactively compresses canonical sub-strings wherever positioned within the input string and having a size, namely a number of bits, progressively decreasing at each iteration, by also storing an index assembly that indicates the position of each sub-string within the input binary string. The method also provides for a possible processing operation of the string obtained at the end of the iterations of each repetition. Since all the indexes indicating the position of each sub-string within the input binary string ought to be stored, it is convenient that this be not longer than a maximum number of bits, by eventually subdividing a very extended data sequence into packets having a length not higher than said maximum bit number.

Figure 10:
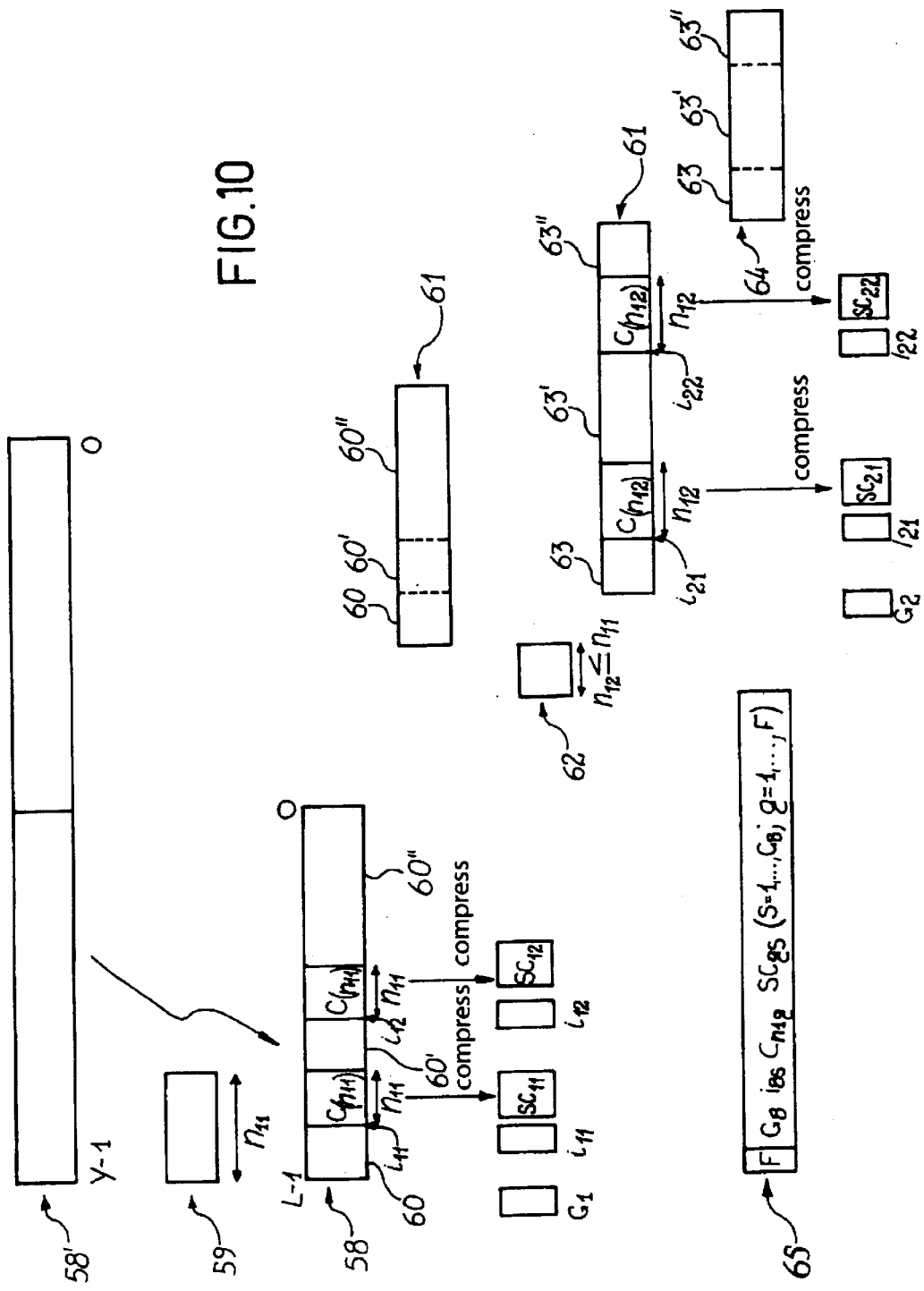
FIG. 10 schematically shows some strings used and/or processed by a further embodiment of the compression method according to this invention.

By referring now to the example of FIG. 10, let us initially assume that the input data string 58 to be compressed has a length L not greater than the allowed maximum length M. Preferably, M is equal to 1024.

The above mentioned seventh embodiment of the compression method scans said string 58 by means of a window 59 having a size $n_{11}$ not greater than a maximum value WD<M. Preferably, $n_{11}$=WD=64 and the window 99 scans said string 58 by shifting itself by a bit pitch $WS_1$, in the range of 1 to WD (where $1 \leq WS_1 \leq WD$), even more preferably, $WS_1$=1.

At each time window 59 identifies a canonical sub-string $C_{n11}$, having a size $n_{11}$, within string 58, an index identifying the position of the canonical sub-string $C_{m11}$ is stored and said canonical sub-string $C_{m11}$ is compressed to a sub-string of smaller size, according to the Fibonacci compression procedure. This also entails that $n_{11}$ is not lower than $n_{min}$=7 (where $n_{min} \leq n_{11} \leq WD$). FIG. 10 shows two canonical sub-strings $C_{n11}$ having an index $i_{11}$ and $i_{12}$, respectively, that are compressed to two corresponding sub-strings $SC_{11}$, and $SC_{12}$. Preferably, said indexes $i_{11}$ and $i_{12}$ are the address of the first bit of the respective canonical sub-string $C_{n11}$ within said string 58; even more preferably, upon identifying a canonical sub-string $C_{n11}$ said window 59 starts again scanning from the first bit subsequent to the canonical sub-string $C_{n11}$ (in the example of FIG. 10, it starts again scanning from bits ($i_{11}+n_{11}$) and ($i_{12}+n_{11}$)).

At the end of the scan by means of window 59, the number $G_1$ of canonical sub-strings $C_{11}$ that have been compressed is stored. These portions 60, 60' and 60" of said string 58 not including canonical sub-strings $C_{n11}$ with size $n_{11}$ are then juxtaposed to one another in a reject string (preferably, the juxtaposition is carried out bit during scanning).

The compression method performs a second scanning operation on the reject string 61 by means of a window 62 having a size $n_{12}$ smaller than $n_{11}$, provided that it is not again lower than $n_{min}$=7 (where $n_{min} \leq n_{12} \leq n_{11}$). Preferably, $n_{12}=n_{11}-1$. Preferably, said window 62 scans said string 58 by shifting itself with a bit pitch $WS_2$ in the range of 1 to WS, (where $1 \leq WS_2 \leq WS_1$), even more preferably $WS_2=WS_1=1$.

Similarly to scanning string 58 by means of the window 59, at each time said window identifies a canonical sub-string $Cn_{12}$ having a size $n_{12}$ within string 61, an index $i_{21}$ and $i_{22}$, which identifies the position of said canonical sub-string $Cn_{12}$ is stored and each canonical sub-string $Cn_{12}$ is compressed to a corresponding sub-string $SC_{12}$ and $SC_{22}$, according to the Fibonacci compression procedure.

At the end of the scan by means of window 62, the number $G_2$ of canonical sub-strings $Cn_{12}$ that have been compressed is stored. These portions 63, 63' and 63" of said string 61 not belonging to canonical sub-strings $Cn_{12}$ having a size $n_{12}$ are juxtaposed to one another in order to form a second reject string 64.

Subsequently, the concerned compression method iterates the scans of the reject strings as obtained from the previous scan, by means of subsequent windows having a progressively decreasing size $n_{1g}$. Preferably, $n_{1g}=n_{1g-1}-1$. In particular, it is also possible that no canonical sub-string $n_{1g}$ having a size $n_{1g}$ is identified during one or more intermediate iterations; in such case, only the number $G_g$ of canonical sub-strings $Cn_{1g}$ that have been compressed, equal to zero, is stored.

Furthermore, according to this method, at least starting from a specific scan (or from a specific size $n_{1g}$ of the scanning window), the canonical sub-strings $Cn_{1g}$ are juxtaposed to one another, so as to form groups comprising at least two of them; then the Fibonacci compression is carried out on the so obtained juxtaposition.

The iterations are terminated when it is no more possible to compress the last generated reject string; this occurs in three cases:

when the latest generated reject string is void, or when the integer input data string 58 has been compressed, or when the latest generated reject string is too small to be effectively compressed or the bits added to store $G_g$ and the portion indexes officer the saving ($G_g \cdot \Delta$) that can be achieved by the maximum number of compressable strings, or when the size $n_{1g}=n_{1G1}$ of the last scan window by which it has been attempted to identify canonical sub-strings is equal to 6 bits.

At the end of the iterations, the method provides for creating a compressed string 65 comprising:

the number F of scans carried out up to the last scan in which an effective compression operation has been performed (such number also accounts for any intermediate possible iterations that have not identified and compressed canonical sub-strings);

the reject string generated by the last iteration F, and for each scan g, where g=1, . . . , F:

the number $G_g$ of compressed canonical sub-strings, for each canonical sub-string $C_{m1g}$:

the index $i_{gs}$=(where S=1, . . . , $G_g$) that identifies the position of the canonical sub-string within the reject string generated by preceding iteration (g–l), and the compressed sub-string $SC_{gs}$ (where S=1, . . . $G_g$).

In particular, the various previously listed information items can be stored in the compressed string 65 by juxtaposition according to any pre-established order, preferably with the scan number F positioned at the begin or at the end of the compressed string 65.

According to this method, the compressed string 65 is subsequently subjected to a second repetition of the previously described iterations. In particular, the compressed string 65 is scanned by means of a first window having a size $n_{21}$ not greater than the maximum value WD, preferably $n_{21}=n_{21}$; in similar way, in the iterations subsequent to the first one, the window sizes are preferably equal to the sizes relating to the first repetition ($n_{2g}=n_{1g}$).

The method provides for performing further repetitions of the iterative scans on the compressed strings as achieved at the end of each repetition.

At the end of a repetition, should no iteration succeeded in identifying a canonical sub-string to be compressed, the method provides for processing the compressed string generated by the last repetition in which at least one canonical sub-string has been compressed in at least one iteration. Such processing operation preferably includes:

- a logic NOT operation carried out on the integer compressed string, and/or
- a logic XOR operation of at least one portion of the compressed string by means of at least one mask suitably computed in order to maximise the difference between the number of bit pairs equal to "11" which are eliminated and the number of bits pairs equal to "11" which are created, and/or
- an operation of binary arithmetics, such as, for instance, the addition of at least one bit lock of the compressed string to at least one constant binary value.

The method can also provide for storing a flag indicating the types of the processing operation carried out (in the case it could provide for more than one) and/or of the possible masks of the logic XOR operation and/or of the possible constant binary values and/or of any identification indexes to identify the bit blocks of the compressed string subjected to a processing operation.

In this way, the method is terminated when the desired value of the compression ratio CR is reached.

By newly referring to the example of FIG. 10, it can be observed that, when the input data sequence 58' to be compressed has a size Y greater than the maximum allowable size M, said sequence 58' is subdivided into data packets 58 having a size L=M, each of which is separately subjected to the seventh embodiment of the just now described. Since, in general, Y is not a multiple of M, the last data packet has a size smaller than M. Eventually, after a pre-established number of repetitions, the method can provide for a juxtaposition of at least two compressed strings belonging to different data packets.

Figure 11:
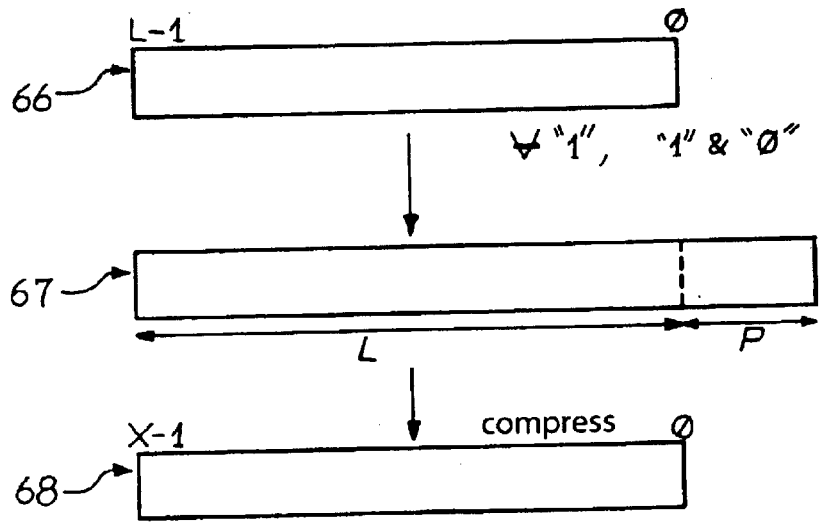
FIG. 11 schematically shows some strings used and/or processed by a further embodiment of the compression method according to this invention.

By referring now to FIG. 11, it can be observed that an eighth embodiment of the compression method according to this invention provides for a first counting step aimed at counting the number P of bits having a value "1" included in the input binary string 66 to be compressed, having a size L. Subsequently, when the number P is not higher than a suitable threshold value $P_{MAX}$, an extended string 67 is created from said string 66 by juxtaposition of a bit "0" to each one of the P bits equal to "1"; the extended string 67 has a size (L+P). Lastly, the Fibonacci compression procedure is carried out on said extended string 67, that comprises only canonical sub-strings, in order to generate a complex string 68 having a size X.

The threshold value $P_{MAX}$ is given by the maximum value of P that enables to make $$X \leq L \tag{18}$$

In particular, referring to formula (14), the $P_{MAX}$ value is furnished by the following formula $$(L + P_{MAX})(1 - CR) = (L + P_{MAX})\left(1 - \frac{\Delta}{n}\right) = (L + P_{MAX})\frac{m}{n} < L \tag{19}$$

Therefore, it applies:

$$P_{MAX} < L\left(\frac{1}{CR} - 1\right) = L\left(1 - \frac{m}{n}\right) \tag{20}$$

In other words, the number P of bits equal to "1" appearing in the input binary string 66 to be compressed ought to be not higher than the following percentage value of size L of the binary string 66.

$$\frac{P}{L} < \left(1 - \frac{m}{n}\right) \tag{21}$$

When the number V of bits equal to "0" appearing in the input binary string 66 is not higher than the threshold value $P_{MAX}$ or when the number P of bits equal to "1" is not lower than a value (L–$P_{MAX}$), the method can provide for a preliminary logic NOT operation carried out on said binary string 66 so as to enable the method of FIG. 11 to be applied to the inverted string. Similarly, the method can also provide for a logic XOR operation to be carried out on said binary string 66 by means of mask comprising a number r of bits not higher than L (where r≦L), suitably designed so that the string furnished by said XOR operation fulfils condition (12) and consequently the method of FIG. 11 is applicable to sit. When the size r of the mask is smaller than or size value L of the input binary string 66, the logic XOR operation can be carried out by subdividing said string 66 into packets including a number r of bits.

In particular, the above mentioned eighth embodiment of the compression method can be applied to a data binary string to be compressed in combination with one or more embodiments.

As previously described, given a n-bit binary string and considered the assembly of numeric values N that can be represented by means of the Fibonacci representation, while all numeric values N are represented by a canonical string, not all of the numeric values N are represented by further redundant strings and, consequently, the number of redundant strings generally varies as the specific numeric value N (among the ones also represented by redundant strings) varies.

A ninth embodiment of the compression method according to the invention exploits this property of the Fibonacci representation.

Figure 12:
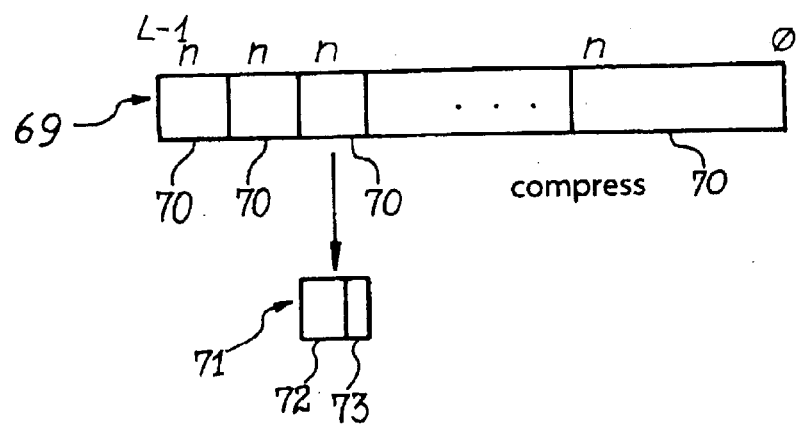
FIG. 12 schematically shows some strings used and/or processed by a further embodiment of the compression method according to this invention.

By referring to FIG. 12, it can be observed that the input binary string 69 to be compressed, having a size L, is subdivided into sub-strings 70 each comprising n bits. Should said size L of the binary string be not a multiple of n, the last sub-string is filled with a tail of bits equal to "0."

Each sub-string 70, both canonical and redundant, is compressed by the Fibonacci compression procedure to a sub-string 71 including a first portion 72, designated as "mantissa," comprising a number m of bits fixed in respect of all sub-strings 71, and a second portion 73, designated as "exponent," comprising a number Z of bits, that is variable as the mantissa 72 varies. The number Z of bits in the exponent 73, where z≧0, is equal to the number of bits needed for representing the number of redundant strings of the Fibonacci representation of the numeric value N represented by the binary representation 73. In particular, according to the method, the order of all of the canonical and redundant strings of the Fibonacci representation of each numeric value N is pre-established and the exponent 73 identifies the index of the Fibonacci representation furnished by the corresponding sub-string 70.

Starting from the numeric value N furnished by the binary mantissa 72, the number of its possible Fibonacci representations, or the number of any possible redundant strings, appears to be uniquely determined and, therefore, the number Z of bits of the exponent 73 is uniquely determined, as well. In particular, when the numeric value N has one only (canonical) Fibonacci representation, exponent 73 is void (Z=0). Preferably, when the numeric value N has also at least one redundant Fibonacci representation, the index relating to the canonical string as stored in said exponent 73 is the one having all of the bits equal to "0."

The method provides for creating a compressed string 74 with a size X by juxtaposition of a sub-string 75 for storing the size L of the input binary string 69 and of the ordered assembly of compressed sub-strings 71. In particular, said sub-string 75 is not compressed and preferably comprises always the same number of bits.

According to this method, said compressed string 74 is in turn subjected to compression, as it is shown in FIG. 12, with exclusion of said sub-string 75 that remains un-compressed and is also part of the further string generated by the second iteration of the compression procedure.

The compression method of FIG. 12 can be iterated as long as the size $X_{END}$ of the last compressed string appears to be not greater than a maximum preestablished value D, selectable by an operator.

Based upon the fact that not all of the numeric value N are represented, by means of a Fibonacci representation, by further redundant strings and that the number of redundant strings varies as the specific numeric value N varies, it is easy to realise that, mainly when the number n of bits included in said sub-strings 70 varies, the above illustrated ninth embodiment of the concerned compression method has been found to be efficient in view of the fact that the bit saving that can be obtained by means of said sub-strings 71 having a number (m+Z) of bits higher than n.

For each compressed sub-string 71, the de-compression method according to the above ninth embodiment of the compression method, automatically computers, by reading the numeric value N contained in the mantissa 72, the number of the corresponding Fibonacci representations and, should such number be higher than 1, and, by reading the binary value of said exponent 73, it identifies which Fibonacci representation, between the canonical and the redundant ones, ought to be assigned to the de-compressed sub-string 70. In particular, such identification can be realised by means of a suitable processing operation following under the possibilities of a person skilled in the art, based upon the teaching of this invention, or by directly reading a table structured in order that the mantissa 72 and the exponent 73 furnish the address value of the item of the table in which the specific Fibonacci string to be assigned to the de-compressed sub string 70 is stored.

A tenth embodiment of the compression method according to this invention is based upon definition of a pre-established order of all the canonical and redundant strings of the Fibonacci representation of each numeric value N, so as to establish a redundancy order of the strings. Preferably, the canonical strings corresponds to the first redundancy order.

In particular, the input binary string to be compressed, having a size L, is subdivided into sub-strings each comprising n bits. Should the dimension L of the input binary string be not a multiple of n, the last sub-string is filled with a tail of bits equal to "0."

Subsequently, the method performs a first iteration in which it compresses all strings corresponding to the first redundancy order and stores information relating to their position in the input binary string (for instance, the serial index of the sub-string within the input binary string). Preferably, at the end of the first iteration, the number of sub-strings corresponding to the first redundancy order that have been all compressed is stored. Those portions of the input string not including sub-strings corresponding to the first redundancy order are juxtaposed to one another in a first reject string.

Subsequently, the method performs a second iteration in which it compresses all strings corresponding to the second redundancy order and stores information relating to their position in the first reject string (for instance, the serial index of the sub-string within the first reject string). Preferably, at the end of the second iteration, the number of sub-strings corresponding to the second redundancy order that have been all compressed is stored. Those portions of the reject string not including sub-strings corresponding to the second redundancy order are juxtaposed to one another in a second reject string.

The method again performs further similar iterations, in each of which it compresses all of the sub-strings corresponding to a further redundancy order. The method performs all of the iterations up to the last redundancy order or it is terminated as soon as all of the sub-strings into which the input binary string had been subdivided are compressed (and, therefore, the last generated reject string is void). The last iteration does not store the information relating to the position of the sub-string that are being compressed within the reject string generated by the preceding iteration, due to the fact that, since all of the sub-strings are stored, it is only sufficient to know their number.

The compressed output data binary string comprises, for each iteration, the compressed sub-strings and all information in respect of their number and of the positions (with exclusion of the last iteration) of the starting sub-strings.

Since, by exploiting this invention, it is possible to compress a data sequence up to reaching very small sizes, the advantages achievable by exploitation if this invention will be apparent, particularly in the field of the computer and telecommunication technologies.

In some laboratory tests, the inventor ascertained the possibility to compress an input data binary string having a size L to an output binary string having a size D, with a very high compression ratio, defined as $$\frac{L-D}{L}$$

between the bit amount saved in the compressed string and the size of the input string.

In particular, the compression method according to this invention is adapted to compress in the same way input binary strings of any type, without applying compression optimization techniques specifically conceived for a particular file type, as it occurs in presently most generally adopted conventional compression methods.

On the other hand, since the methods according to this invention are substantially straightforward from a processing view point, the software and/or hardware implementation of this invention turn out to be extremely efficient and substantially rapid.

The compression method according to this invention allows to store, upon compression, large data amounts under an extremely restricted and freely selective memory occupation. This enables for instance stationery or movement image sequences to be stored without information loss (lossless) on memory media of limited capability (for instance movie films presently recorded on DVD, upon compression by the method according to this invention, could be stored on a single CD-ROM).

In similar way, as concerns the telecommunication field, the compression method allows to transmit large data amounts upon compression, in short times on channels of restricted capability, thereby achieving a very noticeable cost reduction. This could allow to transmit for instance television channel in real time on the Internet network, without image degradation (lossless), thereby also realizing interactive channels, such as Video on Demand. The concerned method could also allow the cellular radiotelephones to be connected in real time and at low cost to the Internet network.

Lastly, the present invention could also be applied to cryptographying information and/or messages, by suitably processing the concerned data during compression (for instance by performing a binary arithmetic operation on at least a portion of the string to be compressed, before, during or at the end of the compression procedure).

The preferred embodiments have been above described and some modifications of this invention have been suggested, but it should be understood that those skilled in the art can make other modifications and changes without departing from the scope of the invention as defined in the following claims.

What is claimed is:

1. A compression method for compressing an input data binary string having a number, L, of bits, to a compressed output data binary string, having a number, X, of bits, characterized in that at least one sub-string $a_{n-1}a_{n-2} \ldots a_1a_0$, having a number, n, of bits, of the input binary string is construed by assigning a integer numeric value, N, equal to a sum of items of a monotonic increasing succession $S=\{s_0, s_1, s_2, \ldots\}$ of integer numbers, among the first n items of such succession S, whose corresponding $a_i$ is equal to "1," according to the formula:

$$N = a_{n-1} \cdot s_{n-1} + a_{n-2} \cdot s_{n-2} + \ldots + a_1 \cdot s_1 + a_0 \cdot s_0 = \sum_{i=0}^{n-1} a_i \cdot s_i$$

and, for each sub-string $a_{n-1}a_{n-2} \ldots a_1a_0$, a compressed binary sub-string $d_{m-1}d_{m-2} \ldots d_1d_0$ is created, comprising m bits, in which the binary representation of said integer numeric value N, as assigned to the corresponding sub-string an $a_{n-1}a_{n-2} \ldots a_1a_0$, is stored, the binary representation of N being furnished by the formula:

$$N = d_{m-1} \cdot 2^{m-1} + d_{m-2} \cdot 2^{m-2} + \ldots + d_1 \cdot 2^1 + d_0 \cdot 2^0 = \sum_{i=0}^{m-1} d_i \cdot 2^i,$$

said output data binary string comprising, for each sub-string $a_{n-1}a_{n-2} \ldots a_1a_0$, a corresponding compressed binary sub-string $d_{m-1}d_{m-2} \ldots d_1d_0$ and the data of said input binary string lacking of said at least one sub-string $a_{n-1}a_{n-2} \ldots a_1a_0$, the ratio $$R_k = \frac{s_k}{s_{k-1}},$$

where k=1, 2, . . . , between two consecutive items of said succession S, fulfilling the condition expressed by the formula:

$$R_k < 2 \text{ where } k \geq q \geq 1,$$

the number n of bits of said at least one sub-string $a_{n-1}a_{n-2} \ldots a_1a_0$ being in the range between a minimum value $n_{min}$ and the number L of bits included in said input data binary string, according to formula:

$$n_{min} \leq n \leq L,$$

a minimum value $n_{min}$ being equal to the minimum value of n that fulfills the following condition:

$$m = int_{sup}\left[\log_2\left(\sum_{i=0}^{n-1} s_i\right)\right] < n$$

where the function $y=int_{sup}[x]$ returns the minimum integer value not lower than x ($y \geq x$).

2. A method according to claim 1, characterized in that the first item $s_0$ of said succession S is equal to 1 ($s_0=1$).

3. A method according to claim 2, characterized in that the second item $s_1$ of said succession S is equal to 2 ($s_1=2$).

4. A method according to claim 1, characterized in that said ratio $R_k$ between two consecutive items of said succession S trends to a constant value R when said index k increases, according to formula $$\lim_{k \to \infty} R_k = R.$$

5. A method according to claim 1, characterized in that said ratio $R_k$ between two consecutive items of said succession S is never higher than 2, or $$R_k \leq 2 \text{ where } k \geq 1.$$

6. A method according to claim 1, characterized in that, starting from the (r+1)-th item, or for $k \geq r$, each item $s_k$ of said succession S is equal to a polynomial of the p preceding items, where $1 \leq p \leq r$, according to formula $$s_k = \sum_{h=1}^{p} e_h \cdot s_{k-h} \text{ per } k \geq r \geq p,$$

where the p coefficients $e_h$, where h=1, 2, . . . , p, are constant positive, negative or zero integer numeric values.

7. A method according to claim 1, characterized in that said succession S is defined by the following formula:

$$S = S_{Fib} = \{s_0, s_1, s_2, \ldots\} = \begin{cases} s_0 = 1 \\ s_1 = 2 \\ s_k = s_{k-1} + s_{k-2} \end{cases} \text{ where } k \geq 2.$$

8. A method according to claim 7, characterized in that $n \geq 10$.

9. A method according to claim 8, characterized in that $n \geq 13$.

10. A method according to claim 1 further comprising the steps of:

storing the information relating to the number L of bits of said input data binary string;

assigning the input binary string to an auxiliary string designated as "CURRENT STRING;"

looping through the following sub-steps:

(a) compressing the CURRENT STRING to a second auxiliary string designated as "COMPRESSED STRING;"

(b) checking whether said CURRENT STRING has been effectively compressed;

(c) if the result of step (b) is positive, then checking whether said COMPRESSED STRING has a size greater than a pre-established value D, where D<L;

(d) if the result of step (c) is positive, then assignting the COMPRESSED STRING to the CURRENT STRING and repeating sub-steps (a)–(c);

(e) if any of sub-steps (c) or (d) is negative, checking whether the size of the juxtaposition of the information concerning the size, L, and of the COMPRESSED STRING is smaller than L;

(f) if the result of sub-step (e) is positive, assigning the juxtaposition of the information relating to size L and of the COMPRESSED STRING to the output data binary string; and (g) if the result of sub-step (e) is negative, then assigning the input data binary string to the compressed output data binary string.

11. A method according to claim 10, characterized in that the information concerning the number L of bits of the input data binary string is stored by a pre-established number t of bits.

12. A method according to claim 10 characterized in that said sub-step (a) for compressing said CURRENT STRING to said COMPRESSED STRING comprises the following steps:

subdividing said CURRENT STRING into l sub-strings comprising n bits, where $n \geq n_{min}$; and scanning said sub-strings at least once.

13. A method according to claim 12, characterized in the sub-step (a), when the size W of said CURRENT STRING is not a multiple of n, fills at least a substring with a tail of bits equal to "0."

14. A method according to claim 13, characterized in that the sub-step (a), fills the last sub-string with a tail of bits equal to "0" when the size W of said CURRENT STRING is not a multiple of n.

15. A method according to claim 12 characterized in that the sub-step (a), for at least one sub-string not comprising two consecutive bits equal to "1," designated as a canonical sub-string, creates a corresponding compressed binary sub-string $d_{m-1}d_{m-2} \ldots d_1d_0$.

16. A method according to claim 15 characterized in that the sub-step (a), for each sub-string not comprising two consecutive bits equal to "1," designated as a canonical sub-string, and not adjacently successive to another canonical sub-string creates a corresponding compressed binary sub-string $d_{m-1}d_{m-2} \ldots d_1d_0$.

17. A method according to claim 16, characterized in that the sub-step (a) performs a processing operation on at least one sub-string comprising at least two consecutive bits equal to "1," designated as a redundant or non-canonical sub-string, and, when the sub-string obtained by processing said redundant sub-string is canonical, creates a compressed binary sub-string $d_{m-1}d_{m-2} \ldots d_1d_0$ corresponding to said processed sub-string.

18. A method according to claim 17, characterized in that the sub-step (a) performs said processing operation during the same scan of the l sub-strings in which it creates the compressed binary sub-strings corresponding to the canonical sub-strings.

19. A method according to claim 17 characterized in that the sub-step (a) performs said processing operation in a scan of the l sub-strings subsequent to the scan during which it creates the compressed binary sub-strings corresponding to the canonical sub-strings.

20. A method according to claim 19, characterized in that the sub-step (a) performs said processing operation for each redundant or non-canonical sub-string that is not adjacent, in the scanning order, to another sub-string for which a compressed binary sub-string has been created.

21. A method according to claim 17 wherein said processing operation includes a logic NOT operation.

22. A method according to claim 17, characterized in that said processing operation includes a logic XOR operation with at least one mask.

23. A method according to claim 22, wherein the at least one mask comprises a number r of bits not higher than n ($r \leq n$), which mask is defined as the one that makes the maximum number of redundant sub-strings to be processed canonical.

24. A method according to claim 17, characterized in that said processing operation comprises a binary arithmetic operation that is performed by using at least a binary constant, comprising a number r of bits not higher than n ($r \leq n$).

25. A method according to any one of preceding claim 17, characterized in that said header string comprises, for each sub-string of said CURRENT STRING that is compressed after having been processed, at least a corresponding bit to indicate the processing type performed on the corresponding sub-string.

26. A method according to claim 16, characterized in that the sub-step (a) performs a processing operation on each sub-string comprising at least two consecutive bits equal to "1," designated as a redundant or non-canonical sub-string, and, not adjacently successive to another substring for which a compressed binary sub-string has been created, and, when the sub-string obtained by processing said redundant sub-string is canonical, creates a compressed binary sub-string $d_{m-1}d_{m-2} \ldots d_1d_0$ corresponding to said processed sub-string.

27. A method according to claim 15 characterized in that the sub-step (a) further comprises the operation of creating a header string comprising, for each of the l sub-strings into which said CURRENT STRING is subdivided, an assembly of bits which indicates whether the corresponding sub-string of the CURRENT STRING has been compressed, whether the corresponding sub-string of the CURRENT STRING has been compressed after having been processed, or the processing type performed on the corresponding sub-string of the CURRENT STRING.

28. A method according to claim 27, characterized in that said header string comprises l bits, each of which uniquely corresponds to a sub-string of the CURRENT STRING and it is equal to "1," if the corresponding sub-string is compressed, or it is equal to "0," if the corresponding sub-string is not compressed.

29. A method according to claim 27, characterized in that said processing operation includes a logic XOR operation with at least one mask and characterized in that said header string further comprises said at least one mask.

30. A method according to claim 29, characterized in that the sub-step (a) compresses at least one sub-string an $a_{n'-1}a_{n'-2} \ldots a_1a_0$, having a number n' of bits, where $n' \leq l$, of the header string.

31. A method according to claim 30 characterized in that a flag comprising one or more bits is inserted ahead of or following to said COMPRESSED STRING, whose binary value indicates the compression type of the header string.

32. A method according to claim 27, characterized in that said processing operation comprises a binary arithmetic operation that is performed by using at least a binary constant, comprising a number r of bits not higher than n ($r \leq n$) and characterized in that said header string further comprises said at least one binary constant.

33. A method according to claim 27 wherein sub-step (a) also comprises the operation of compressing said header string.

34. A method according to claim 27 wherein sub-step (a) further compresses the first header string or at least one other header string corresponding to an l sub-string.

35. A method according to claim 12 characterized in that the sub-step (a) comprises:

a first step iteration, in which a scan of the l sub-strings into which the CURRENT STRING is subdivided is effected and during which, for each sub-string not comprising two consecutive bits equal to "1," designated as canonical sub-string, a corresponding compressed binary string $d_{m-1}d_{m-2} \ldots d_1d_0$ is created, a first header string being also created during such scan and comprising, for each of said l sub-string into which said CURRENT STRING is subdivided, a bit that is equal to "1," if the corresponding sub-string is compressed, or a bit that is equal to "0," if the corresponding sub-string is not compressed; and one or more further step iterations, in which a processing operation is performed on each sub-string in respect of which, during the preceding iteration, no corresponding compressed binary sub-string $d_{m-1}d_{m-2} \ldots d_1d_0$ has been created, and, when the sub-string as furnished by said processing operation is canonical, a compressed binary sub-string $d_{m-1}d_{m-2} \ldots d_1d_0$ corresponding to the processed sub-string, is created; during each further iteration, a corresponding header string is created which comprises, for each sub-string in connection with which no corresponding compressed binary sub-string $d_{m-1}d_{m-2} \ldots d_1d_0$ has been created, a bit that is equal to "1," if the corresponding sub-string has been compressed after having been processed, or a bit that is equal to "0," if the corresponding sub-string is not compressed after having been processed.

36. A method according to claim 35, characterized in that said processing operation comprises a logic NOT.

37. A method according to claim 35, characterized in that said processing operation comprises a logic XOR with at least one mask including a number r of bits not higher than n ($r \leq n$), which is designated as the mask that makes the maximum number of sub-strings, in respect of which no corresponding compressed binary sub-string $d_{m-1}d_{m-2} \ldots d_1d_0$ as created during the preceding iteration, canonical.

38. A method according to claim 37, characterized in that the processing operation includes a binary arithmetic operation that is performed with at least one binary constant comprising a number r of bits not higher than n ($r \leq n$).

39. A method according to claim 38, characterized in that said header string further comprises said at least one binary constant.

40. A method according to claim 12, characterized in that, in the frame of the sub-step (a), each of said l sub-strings, into which said CURRENT STRING is subdivided is compressed to a compressed sub-string including a first portion designated as "mantissa," comprising a number m of bits, and a second portion designated as "exponent," comprising a number z of bits, that is variable as the mantissa varies, where $z \geq 0$ and equal to the number of bits needed for representing the number of n-bit strings to which the same integer numeric value N corresponds, said sub-step (a) further providing for pre-establishing an order of all of the n-bit strings, to which the same integer numeric value N corresponds, and for the exponent to identify the index of the redundant representation corresponding to the compressed sub-string, said COMPRESSED STRING comprising said compressed sub-strings.

41. A method according to claim 40, characterized in that, when the number of n-bit strings to which the same integer numeric value N corresponds, is higher than 1, the string not comprising two consecutive bits equal to "1," designated as a canonical string, is expressed by said exponent by use of z bits equal to "0."

42. A method according to claim 12, characterized in that sub-step (a) comprises the following steps:

providing a redundancy ordering of all of said n-bit strings to which the same integer numeric value N corresponds, said string redundancy ordering including a first and a second redundancy order;

performing a first step iteration comprising:
compressing all of the sub-strings corresponding to the first redundancy order and storing information concerning their position within the input binary string; and forming a first reject string by juxtaposing those portions of said input binary string not comprising sub-strings corresponding to the first redundancy order to one another, performing a set of further step iterations, each in respect of a corresponding further redundancy order, each further iteration comprising:
compressing all of the sub-strings corresponding to the further redundancy order and storing information concerning their position within the reject string furnished by the preceding iteration; and forming a further reject string by juxtaposing those portions of said reject string furnished by said preceding iteration not comprising sub-strings corresponding to the further redundancy order to one another;

forming said COMPRESSED STRING by juxtaposing at least the following data for each iteration:
the number of compressed sub-strings;
the compressed sub-strings; and
for each iteration with exclusion of the last one, information concerning the positions of the compressed sub-strings within said input binary string or within said reject string furnished by said preceding iteration.

43. A method according to claim 42, characterized in that the method is terminated as soon as all of the substrings into which the input binary string was subdivided are compressed.

44. A method according to claim 42, characterized in that the n-bit strings, not comprising two consecutive bits equal to "1" and designated as canonical strings, belong to the first redundancy order.

45. A method according to claim 10 wherein the sub-step (a) comprises:
a first iteration of steps, in which:
(i) a first scan of the CURRENT STRING is performed by using a first window (59) having a size $n_{11} \geq n_{min}$ not higher than a maximum value WD, said first window scanning said CURRENT STRING by shifting itself by a bit pitch $WS_1$ in the range of 1 to WD ($1 \leq WS_1 \leq WD$);
(ii) each time said first window identifies a sub-string not comprising two consecutive bits equal to "1," designated as a canonical sub-string $C_{n_{11}}$ having a size $n_{11}$, an index that identifies the position of said canonical sub-string $C_{n_{11}}$ within said CURRENT STRING is stored and said canonical sub-string $C_{n_{11}}$ is compressed to a compressed binary sub-string; and
(iii) at the end of the scan, the number $G_1$ of canonical sub-strings $C_{n_{11}}$ that have been compressed and those portions of the CURRENT STRING not belonging to canonical sub-strings $C_{n_{11}}$ having a size $n_{11}$, are juxtaposed to one another in a first reject string; and one or more further steps in which:
(i) a scan of the reject string furnished by a preceding iteration is performed by using a corresponding further window having a progressively decreasing size $n_{1g} \leq n_{1g-1}$, said further window scanning the concerned reject string by shifting itself by a bit pitch $WS_g$ in the range of 1 to $WS_{g-1}$ ($1 \leq WS_g \leq WS_{g-1}$);

(ii) each time said first windows identifies a canonical sub-string $C_{ng}$ having a size $n_{1g}$, an index that identifies the position of said canonical sub-string $C_{ng}$ within said reject string furnished by said preceding iteration is stored and said canonical sub-string $C_{ng}$ is compressed to a compressed binary sub-string, (iii) at the end of the scan, the number $G_g$ of canonical sub-strings $C_{ng}$ that have been compressed and those portions of the reject string furnished by the preceding iteration, not belonging to canonical sub-strings $C_{ng}$ having a size $n_{1g}$, are juxtaposed to one another in a corresponding further reject string;

wherein the iteration of the further steps is terminated when:
(i) the latest generated reject string is void; or
(ii) the latest generated reject string is too small to be effectively compressed; or
(iii) the size $n_{1g}$ of the last scanning window is equal to ($n_{min}-1$);

said COMPRESSED STRING then comprising:
the number F of scans performed up to the latest scan during which an effective compression operation has been performed, the reject string generated by the latest iteration F, and for each scan g, where g=1, ..., F: the number $G_g$ of canonical sub-strings $C_{n_{1g}}$ that have been compressed; and for each canonical sub-string $C_{n_{1g}}$: the index $i_{gs}$ (where s=1, ..., $G_g$)
identifying the position of the canonical sub-string within the reject string generated by the preceding iteration (g-1), and the compressed sub-string $SC_{gs}$, (where s=1, ..., $G_g$).

46. A method according to claim 45, characterized in that said CURRENT STRING has a size not greater than a maximum value M.

47. A method according to claim 46, characterized in that M=1024.

48. A method according to claim 46, characterized in that $WD \leq M$.

49. A method according to claim 45, characterized in that WD=64.

50. A method according to claim 45, characterized in that the sub-step (a) comprises, prior to said first iteration of steps, a processing operation of said CURRENT STRING.

51. A method according to claim 45, characterized in that $n_{1g}=n_{1g-1}-1$.

52. A method according to claim 45, characterized in that $WS_g=WS_{g-1}$.

53. A method according to claim 45, characterized in that $WS_1=1$.

54. A method according to claim 10 characterized in that the sub-step (a) comprises a first step for counting a number P of bits equal to "1" occurring in said CURRENT STRING.

55. A method according to claim 54, characterized in that, when said number P fulfils the following condition:

$$\frac{P}{L} < \left(1 - \frac{m}{n}\right),$$

an extended string is created starting from the CURRENT STRING by juxtaposing a bit "0" to each of said P bits equal to "1."

56. A method according to claim 54, characterized in that, when said number P fulfils the following condition:

$$\frac{P}{L} \geq \left(1 - \frac{m}{n}\right),$$

a logic NOT operation is performed on said current string and an extended string is created starting from the string generated by said NOT operation by juxtaposing a bit "0" to each bit equal to "1."

57. A method according to claim 10, characterized in that the sub-step (a) comprises performing a logic XOR operation on said CURRENT STRING by means of at least one mask comprising a number r of bits not higher than L ($r \leq L$), designed in order that the string generated by said XOR operation fulfils the following condition $$\frac{P}{L} < \left(1 - \frac{m}{n}\right),$$

and subsequently creating an extended string starting from the string generated by said XOR operation by juxtaposing a bit "0" to each bit equal to "1."

58. A method for de-compression of a compressed binary string characterized in that said compressed binary string is generated starting from a data binary string comprising a number L of bits, by the compression method according to claim 1.

59. An electronic apparatus comprising at least a central processing unit and at least a memory unit, characterized in that it performs the de-compression method according to claim 58.

60. A processor program comprising code means adapted to perform, when they operate on a processor, the de-compression method according to claim 58.

61. A memory medium readable by a processor, having a program stored therein, characterized in that said program is a processor program according to claim 60.

62. An electronic apparatus comprising at least a central processing unit and at least a memory unit, characterized in that it performs the compression method of claim 1.

63. An electric, magnetic or electromagnetic signal modulated by a digital signal comprising at least one data string, characterized in that said at least one data string is a compressed binary string generated, starting from a data binary string having a number L of bits, by the compression method of claim 1.

64. A memory medium readable by a processor containing at least one data string, characterized in that said at least one data string is a compressed binary string generated, starting from a data binary string having a number L of bits, by the compression method according to claim 1.

65. A processor program comprising code means adapted to perform, when they operate on a processor, the compression method according to claim 1.

66. A memory medium readable by a processor, having a program stored therein, characterized in that said program is a processor program according to claim 65.

* * * * *